(12) United States Patent
Nguyen et al.

(10) Patent No.: US 10,131,994 B2
(45) Date of Patent: *Nov. 20, 2018

(54) INDUCTIVELY COUPLED PLASMA SOURCE WITH TOP COIL OVER A CEILING AND AN INDEPENDENT SIDE COIL AND INDEPENDENT AIR FLOW

(71) Applicant: APPLIED MATERIALS, INC., Santa Clara, CA (US)

(72) Inventors: Andrew Nguyen, San Jose, CA (US); Kenneth S. Collins, San Jose, CA (US); Kartik Ramaswamy, San Jose, CA (US); Shahid Rauf, Pleasanton, CA (US); James D. Carducci, Sunnyvale, CA (US); Douglas A. Buchberger, Jr., Livermore, CA (US); Ankur Agarwal, Fremont, CA (US); Jason A. Kenney, Sunnyvale, CA (US); Leonid Dorf, San Jose, CA (US); Ajit Balakrishna, Sunnyvale, CA (US); Richard Fovell, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 947 days.

This patent is subject to a terminal disclaimer.

(21) Appl. No.: 13/666,245

(22) Filed: Nov. 1, 2012

(65) Prior Publication Data

US 2014/0020836 A1  Jan. 23, 2014

Related U.S. Application Data

(60) Provisional application No. 61/673,937, filed on Jul. 20, 2012.

(51) Int. Cl.
C23C 16/00 (2006.01)
H01L 21/306 (2006.01)
(Continued)

(52) U.S. Cl.
CPC ............... *C23F 1/08* (2013.01); *B01J 12/002* (2013.01); *C23C 14/28* (2013.01); *H01J 37/321* (2013.01);
(Continued)

(58) Field of Classification Search
CPC ................ H01J 37/321; H01J 37/3211; H01J 37/32119; H01J 37/32128;
(Continued)

(56) References Cited

U.S. PATENT DOCUMENTS 5,571,366 A * 11/1996 Ishii .................. H01J 37/32082
118/723 I
5,620,523 A * 4/1997 Maeda ................. H01J 37/3211
118/715

(Continued)

FOREIGN PATENT DOCUMENTS

JP 2004-200429 A 7/2004
KR 10-2004-0102300 A 12/2004
(Continued)

OTHER PUBLICATIONS

Official Action dated Feb. 10, 2016 Issued in Co-Pending U.S. Appl. No. 13/897,592.

(Continued)

*Primary Examiner* — Luz L Alejandro Mulero
(74) *Attorney, Agent, or Firm* — Fish & Richardson P.C.

(57) ABSTRACT

A plasma reactor for processing a workpiece includes a reactor chamber having a ceiling and a sidewall and a workpiece support facing the ceiling and defining a processing region, and a pair of concentric independently excited RF coil antennas overlying the ceiling and a side RF coil concentric with the side wall and facing the side wall below the ceiling, and being excited independently.

13 Claims, 22 Drawing Sheets

(51) Int. Cl.
*C23F 1/08* (2006.01)
*C23C 14/28* (2006.01)
*H01J 37/32* (2006.01)
*H05H 1/46* (2006.01)
*B01J 12/00* (2006.01)

(52) U.S. Cl.
CPC ..... *H01J 37/3211* (2013.01); *H01J 37/32733* (2013.01); *H01J 37/32834* (2013.01); *H05H 1/46* (2013.01)

(58) Field of Classification Search
CPC .......... H01J 37/32137; H01J 37/32146; H01J 37/32155; H01J 37/32165; H01J 37/32174; H01J 37/32183; H01J 37/32834; H01J 37/32522
USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 5,792,272 | A | * | 8/1998 | van Os ............... C23C 16/4405 118/723 I |
| 5,897,713 | A | | 4/1999 | Tomioka et al. |
| 5,948,704 | A | | 9/1999 | Benjamin et al. |
| 6,024,826 | A | * | 2/2000 | Collins ............. H01J 37/32082 118/723 E |
| 6,051,073 | A | * | 4/2000 | Chu ....................... H01J 37/321 118/723 E |
| 6,083,344 | A | * | 7/2000 | Hanawa ................ H01J 37/321 156/345.28 |
| 6,089,182 | A | | 7/2000 | Hama |
| 6,129,808 | A | * | 10/2000 | Wicker ................. H01J 37/321 118/723 E |
| 6,200,412 | B1 | * | 3/2001 | Kilgore ............... C23C 16/4405 118/715 |
| 6,326,597 | B1 | * | 12/2001 | Lubomirsky ..... H01L 21/67248 118/723 R |
| 6,367,410 | B1 | * | 4/2002 | Leahey ............. H01L 21/67103 118/58 |
| 6,414,648 | B1 | * | 7/2002 | Holland ................ H01J 37/321 118/723 I |
| 6,450,117 | B1 | * | 9/2002 | Murugesh ........... C23C 16/4402 118/723 ER |
| 6,451,161 | B1 | * | 9/2002 | Jeng ....................... H01J 37/321 118/723 I |
| 6,518,190 | B1 | * | 2/2003 | Lill ................... H01J 37/32862 118/723 I |
| 6,527,911 | B1 | * | 3/2003 | Yen ................... H01J 37/32623 118/723 E |
| 6,899,787 | B2 | * | 5/2005 | Nakano ............. H01J 37/32183 118/723 AN |
| 8,858,754 | B2 | * | 10/2014 | Horiguchi ........... H01J 37/3244 118/723 E |
| 8,933,628 | B2 | | 1/2015 | Banna et al. |
| 2001/0019048 | A1 | | 9/2001 | Ose et al. |
| 2002/0038791 | A1 | * | 4/2002 | Okumura ............ C23C 16/4412 216/71 |
| 2002/0121345 | A1 | * | 9/2002 | Chen ..................... C23C 16/507 156/345.48 |
| 2003/0213434 | A1 | * | 11/2003 | Gondhalekar ........ C23C 16/507 118/724 |
| 2004/0050327 | A1 | * | 3/2004 | Johnson ............ H01J 37/32082 118/715 |
| 2004/0083971 | A1 | | 5/2004 | Holland et al. |
| 2005/0178748 | A1 | | 8/2005 | Buchberger et al. |
| 2005/0252885 | A1 | | 11/2005 | Tachino et al. |
| 2005/0257743 | A1 | * | 11/2005 | Koshiishi .......... H01J 37/32082 118/723 E |
| 2007/0023145 | A1 | | 2/2007 | Bera et al. |
| 2009/0159213 | A1 | | 6/2009 | Bera et al. |
| 2009/0159425 | A1 | | 6/2009 | Liu et al. |
| 2009/0162262 | A1 | | 6/2009 | Bera et al. |
| 2009/0250169 | A1 | | 10/2009 | Carducci et al. |
| 2009/0294065 | A1 | * | 12/2009 | Lai ...................... H01J 37/3244 156/345.47 |
| 2010/0132615 | A1 | | 6/2010 | Kato et al. |
| 2010/0186672 | A1 | * | 7/2010 | Okuda ................ C23C 16/4586 118/723 R |
| 2011/0094996 | A1 | | 4/2011 | Yamazawa et al. |
| 2011/0222038 | A1 | | 9/2011 | Yamashita et al. |
| 2012/0073756 | A1 | | 3/2012 | Yamazawa |
| 2012/0090990 | A1 | * | 4/2012 | Cox ........................ C23C 14/34 204/298.04 |
| 2012/0248066 | A1 | | 10/2012 | Yamazawa |
| 2013/0256271 | A1 | | 10/2013 | Panagopoulos et al. |
| 2013/0278141 | A1 | | 10/2013 | Dorf et al. |
| 2013/0278142 | A1 | | 10/2013 | Dorf et al. |
| 2013/0284370 | A1 | | 10/2013 | Collins et al. |
| 2015/0068682 | A1 | | 3/2015 | Banna et al. |
| 2015/0087157 | A1 | | 3/2015 | Aubuchon et al. |

FOREIGN PATENT DOCUMENTS

| | | |
|---|---|---|
| KR | 10-2009-0102257 A | 9/2009 |
| TW | 201006955 | 2/2010 |
| WO | WO-2008/088110 A1 | 7/2008 |

OTHER PUBLICATIONS

Official Action dated Feb. 10, 2016 Issued in Co-Pending U.S. Appl. No. 14/270,578.
Carducci et al., U.S. Appl. No. 13/629,267, filed Sep. 27, 2012, 25 pages.
Nguyen et al., U.S. Appl. No. 13/666,224, filed Nov. 1, 2012, 55 pages.
Nguyen et al., U.S. Appl. No. 13/666,245, filed Nov. 1, 2012, 59 pages.
Nguyen et al., U.S. Appl. No. 13/666,280, filed Nov. 1, 2012, 60 pages.
Kenney et al., U.S. Appl. No. 13/897,585, filed May 20, 2013, 79 pages.
Kenney et al., U.S. Appl. No. 13/897,592, filed May 20, 2013, 79 pages.
Carducci et al., U.S. Appl. No. 13/966,614, filed Aug. 14, 2013, 88 pages.
Nguyen et al., U.S. Appl. No. 14/270,578, filed May 6, 2014, 94 pages.
Kenney et al., U.S. Appl. No. 14/294,431, filed Jun. 3, 2014, 97 pages.
Carducci et al., U.S. Appl. No. 14/319,089, filed Jun. 30, 2014, 88 pages.

* cited by examiner

INDUCTIVELY COUPLED PLASMA SOURCE WITH TOP COIL OVER A CEILING AND AN INDEPENDENT SIDE COIL AND INDEPENDENT AIR FLOW

CROSS-REFERENCE TO RELATED APPLICATION

This application claims the benefit of U.S. Provisional Application Ser. No. 61/673,937, filed Jul. 20, 2012 entitled SYMMETRICAL MULTIPLE COAXIAL ICP SOURCE AND SYMMETRICAL FLOW CHAMBER, by Andrew Nguyen, et al.

BACKGROUND

Field

Embodiments of the present invention are generally concerned with a plasma processing reactor chamber for processing workpieces, in which plasma is generated by inductive coupling of RF power to process gases inside the chamber.

Description of the Related Art

Electronic devices such as integrated circuits, flat panel displays and the like, are fabricated by a series of processes, in which thin film layers are deposited on substrates and etched into desired patterns. The process steps may include plasma-enhanced reactive ion etching (RIE), plasma-enhanced chemical vapor deposition (CVD), plasma-enhanced physical vapor deposition (PVD).

Uniform distribution of etch rate or deposition rate across the entire surface of the substrate is essential for successful fabrication. Such uniformity is becoming more difficult to achieve, as substrate size is increasing and device geometry is shrinking. In particular, inductively coupled plasma sources can have two concentrically arranged coil antennas over the chamber ceiling, so that uniformity of etch rate distribution can be optimized by adjusting the different RF power levels delivered to the different coil antennas. As workpiece diameter and chamber diameter increase, we have found this approach is not adequate, as the larger size increases the difficulty of attaining the requisite process uniformity. Various sources of process non-uniformity, such as chamber design asymmetries, temperature distribution non-uniformities and gas distribution control become more important.

SUMMARY

A plasma reactor includes an axially symmetrical side wall, a ceiling overlying the side wall and a workpiece support, the side wall, the ceiling and the workpiece support defining a processing region. An inner coil antenna is disposed on an external, side of the ceiling and overlies a first radial zone of the processing region. A middle coil antenna surrounds the inner coil antenna and overlies a second radial zone of the processing region surrounding the first radial zone. For precise control of plasma density near the edge of the processing region, an outer coil antenna is provided below a plane of the ceiling and surrounding the side wall. Plural RF power sources are coupled to respective ones of the inner coil antenna, middle coil antenna and outer coil antenna. A controller governs respective power levels of the plural RF power sources.

In an embodiment, the side wall, the inner coil antenna, the middle coil antenna and the outer coil antenna are coaxial.

The plasma reactor in one embodiment may further include an exhaust chamber assembly, the exhaust chamber assembly including: (a) an exhaust chamber wall defining an evacuation region at a side of the workpiece support opposite the processing region, the exhaust chamber assembly having an exhaust pump port symmetrically located relative to the axis of symmetry, and (b) plural axial exhaust passages between the processing region and the evacuation region, and symmetrically distributed with respect to the axis of symmetry.

A lift mechanism may be coupled to the workpiece support.

In an embodiment, the ceiling includes a first dielectric window facing the inner and middle coil antennas, and the side wall includes a cylindrical dielectric window facing the outer coil antenna.

In an embodiment, the ceiling includes an annular member supported on the side wall and having a central opening, a peripheral portion of the disk-shaped dielectric window resting on an inner edge of the central opening.

A grounded conductive shield may be disposed between the inner and middle coil antennas and surrounding the inner coil antenna. The grounded conductive shield may include a cylindrical portion coaxial with the side wall.

In one embodiment, each one of the inner, middle or outer coil antennas comprises plural conductor segments wound in a helical shape about an axis of the side wall, each of the conductor segments having a first arc length less than a full circle, successive ones of the conductor segments being offset from one another along an axial direction and being offset from one another along a circumferential direction by a second arc length not exceeding the first arc length. The plural conductor segments are coupled in parallel to one of the RF power sources. In an embodiment, in least one of the inner and middle coil antennas, the first arc length is 180 degrees and the second arc length is 90 degrees, and in the outer coil antenna the first and second arc lengths are 180 degrees.

In accordance with one embodiment, the plasma reactor further includes plural current distributors coupled between respective ones of the inner, middle and outer coil antennas and respective ones of the plural RF power sources, wherein each one of the current distributors comprises a conductive surface coaxial with the axis of symmetry, the conductive surface having (a) a receiving portion coupled to the respective one of the plural RF power sources and (b) a first circular edge coupled to the respective one of the plural coil antennas. Each one of the concentric coil antennas includes plural conductors helically wound about the axis of symmetry, each of the plural conductors having a supply end and a ground end, the first circular edge of each of the current distributors being connected to the supply ends of the respective coil antenna at spaced-apart locations along the first circular edge. The spaced-apart locations may be uniformly distributed.

Respective RF feed assemblies may be coupled between respective ones of the RF power sources and the receiving portions of respective ones of the current distributors. In an embodiment, each of the RF feed assemblies coupled to the middle and outer coil antennas includes: (a) an upper portion comprising an upper RF feed rod extending axially from a respective one of the RF power sources and being located away from the axis of symmetry, (b) plural radial rods extending radially from a common center and being electrically connected to the upper RF feed rod, and (c) plural axial rods extending axially between respective ones of the plural radial rods and the respective current distributor, the axial rods being symmetrically located with respect to the axis of the side wall.

In one embodiment, a conductive grounded plate lies in a radially extending plane intersecting the plural axial rods, and having passages therethrough maintaining separation between the grounded plate and the plural axial rods.

In one embodiment, the RF feed rod assembly coupled to the inner coil antenna is a single axial RF feed rod coaxial with the axis of symmetry, and the receiving portion of the current distributor coupled to the inner coil antenna is an apex coaxial with the wall, the single axial RF feed rod being connected to the apex.

The plasma reactor may further include respective separately controlled heater layers on respective ones of the dielectric windows, a first set of air fans directed along a first air flow path across the disk-shaped dielectric window, a second set of air fans directed along a second air flow path across the cylindrical dielectric window, and a controller independently controlling the respective heater layers and the first and second sets of fans.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
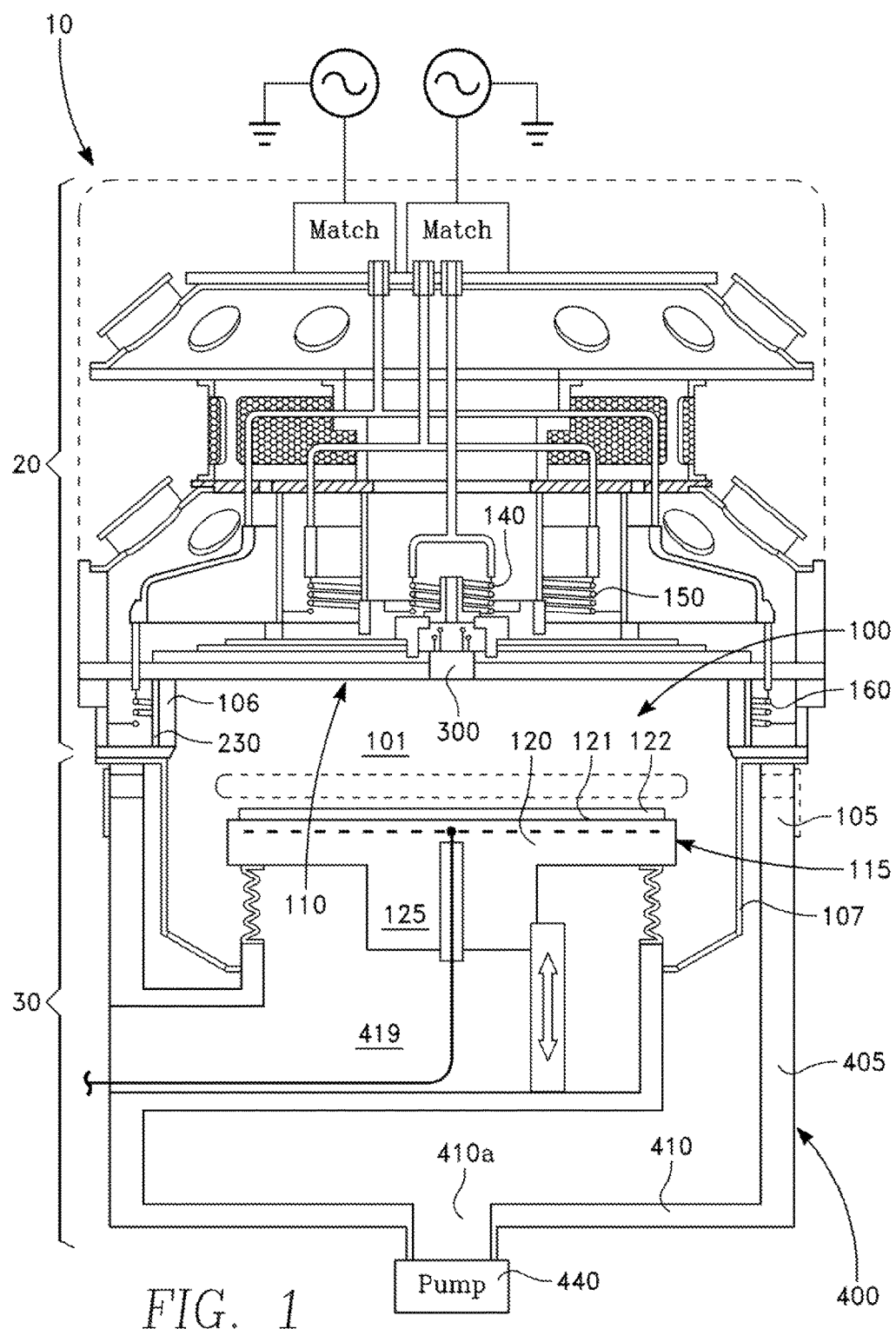
FIG. 1 is a cut-away view of a plasma reactor of an embodiment the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
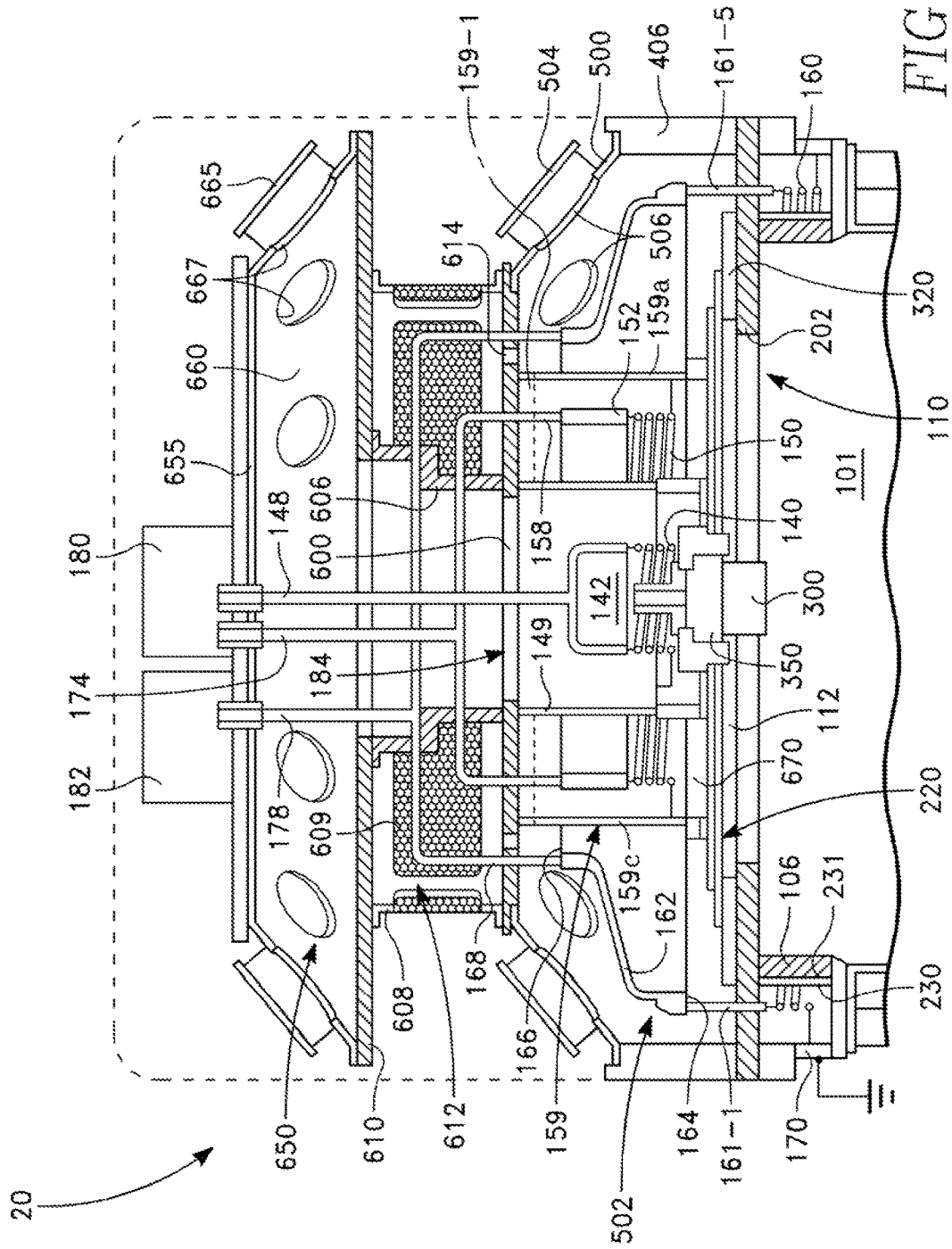
FIG. 1A is an enlarged view of an upper section of the reactor of FIG. 1.
Figure 1B:
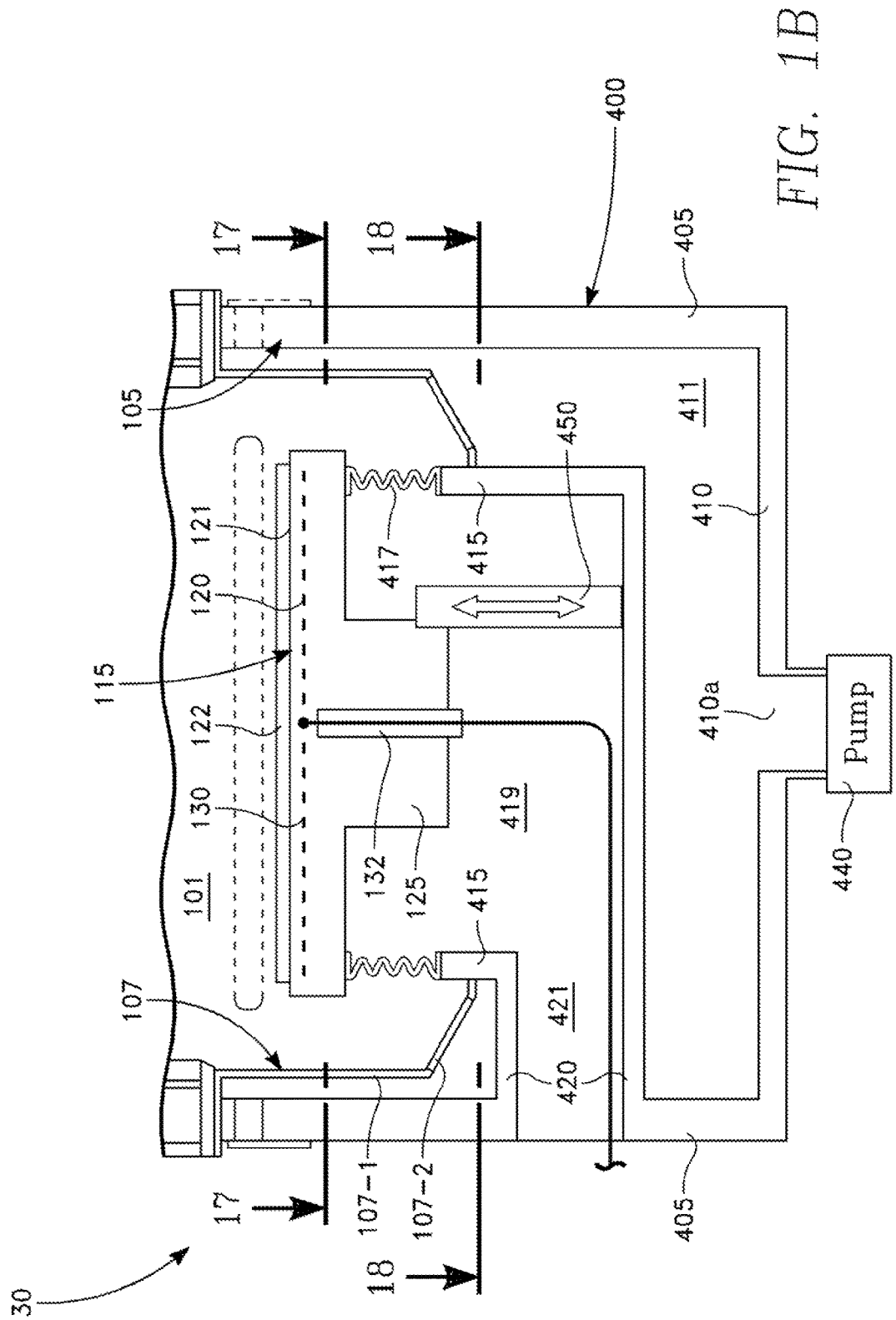
FIG. 1B is an enlarged view of a lower section of the reactor of FIG. 1.

A plasma reactor 10 depicted in FIG. 1 includes an upper portion 20 depicted in the enlarged view of FIG. 1A and a lower portion 30 depicted in the enlarged view of FIG. 1B. Referring to FIGS. 1, 1A and 1B, the plasma reactor 10 includes a plasma processing chamber 100 having a side wall 105 and a lid assembly 110. The side wall 105 has an axially symmetrical shape, such as a cylinder. The side wall 105 includes an axially symmetrical (e.g., cylindrical) dielectric side window 106 and a chamber liner 107, which may be formed of metal. A workpiece support 115 inside the chamber 100 includes a pedestal 120 having a workpiece support surface 121 facing the lid assembly 110 for holding a workpiece 122, and a post 125 supporting the pedestal 120. A processing region 101 of the chamber 100 is confined by the lid assembly 110, the pedestal 120 and the side wall 105. The pedestal 120 may include an insulated internal electrode 130. Optionally, an electrostatic chucking (ESC) voltage and/or RF plasma bias power may be supplied to the internal electrode 130 via a cable 132 extending through the post 125. The cable 132 may be coupled to an RF bias power source (such as an RF impedance match network and/or an RF power generator) as an RF bias feed to the electrode 130. The cable 132 may be provided as a coaxial transmission line, which may be rigid (or flexible), or as a flexible coaxial cable.

Plasma source power is inductively coupled into the processing region 101 by a set of coil antennas, including an inner coil antenna 140, a middle coil antenna 150 and an outer or side coil antenna 160, all of which are concentrically disposed with respect to each other and are coaxial with the axis of symmetry of the side wall 105. The lid assembly 110 includes a disk-shaped dielectric window 112 through which the inner and middle coil antennas 140 and 150 inductively couple RF plasma source power into the processing region 101. The disk-shaped dielectric window 112 is coaxial with the side wall 105 and has a disk-plane parallel, with the plane of the workpiece support surface 121. The side coil antenna 160 inductively couples RF plasma source power into the processing region 101 through the cylindrical dielectric side window 106.

Figure 2:
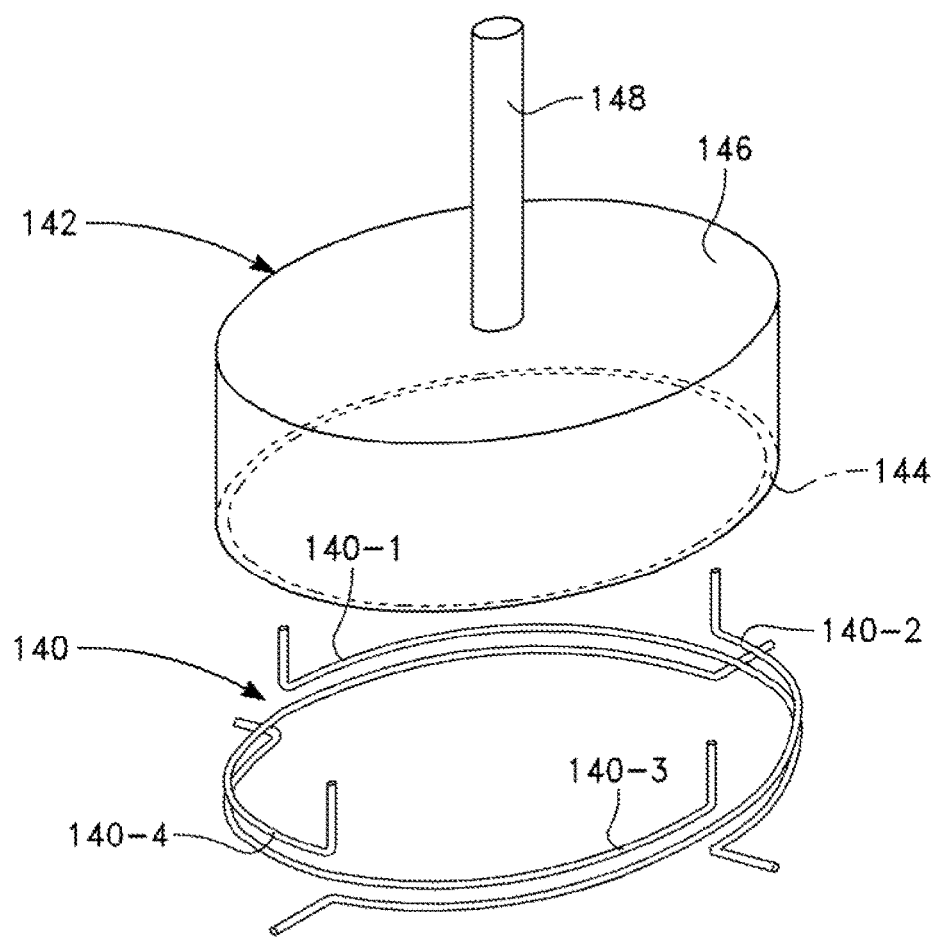
FIG. 2 illustrates an inner zone inductive RF power applicator of the reactor of FIG. 1.

Referring to FIGS. 1A and 2, in one embodiment, the inner coil antenna 140 includes four wire conductors 140-1 through 140-4, each one helically wound about a constant radius along an arc length of 180 degrees, their ends being staggered (i.e., offset along a circumferential direction) at uniformly spaced 90 degree intervals, as depicted in FIG. 2. Uniform and symmetrical distribution of RF power to the wire conductors 140-1 through 140-4 is provided by an RF current distributor in the form of an inverted metal bowl 142 having a circular bottom edge 144 contacting the top ends of each of the wire conductors 140-1 through 140-4, and a lid 146 connected to an inner RF feed rod 148. The bottom ends of the four wire conductors 140-1 through 140-4 are grounded by connection to an inner ground shield 149 (FIG. 1A) in the form of a cylindrical metal sleeve coaxial with the coil antenna 140 and lying between the inner and middle coil antennas 140 and 150. The inner ground shield 149 provides a uniform and symmetrical distribution of ground current from the four wire conductors 140-1 through 140-4, and further provides RF shielding or isolation between the inner and middle coil antennas 140 and 150, by suppressing mutual inductance between them. This enhances independent control of the inner and middle coil antennas 140, 150.

Figure 3:
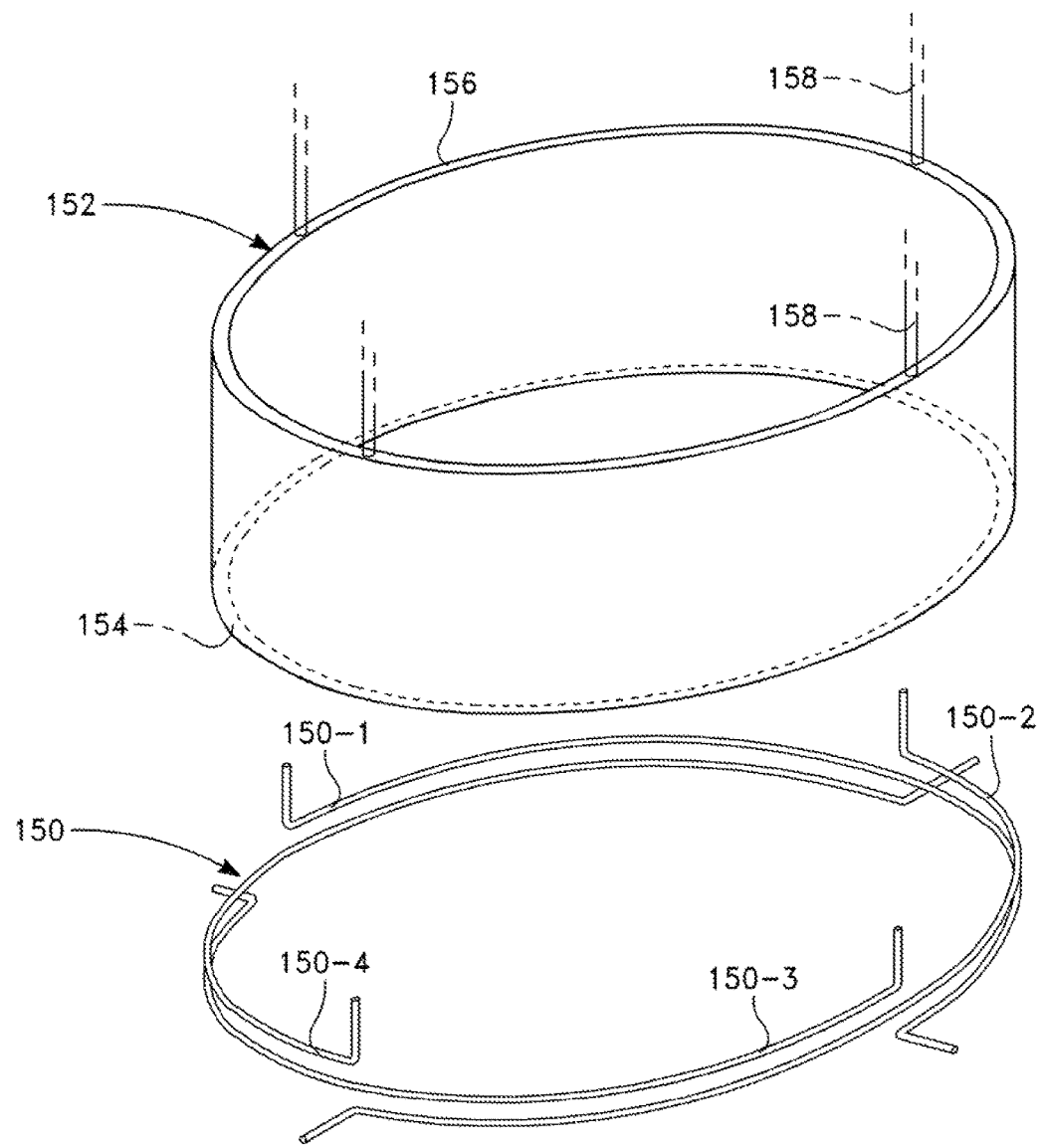
FIG. 3 illustrates an intermediate or middle zone inductive RF power applicator of the reactor of FIG. 1.

Referring to FIGS. 1A and 3, in one embodiment, the middle coil antenna 150 includes four wire conductors 150-1 through 150-4, each one helically wound about a constant radius along an arc length of 180 degrees, their ends being staggered at uniformly spaced 90 degree intervals, as depicted in FIG. 3. Uniform and symmetrical distribution of RF power to the wire conductors 150-1 through 150-4 is provided by an RF current distributor in the form of a cylindrical metal sleeve 152 having a circular bottom edge 154 contacting the top ends of each of the wire conductors 150-1 through 150-4, and a circular top edge 156 connected to a circular array of four axial RF feed rods 158. RF power is fed to the RF feed rods 158 by a conductor structure depicted in FIG. 5, which is described later in this specification.

Referring again to FIG. 1A, the bottom ends of the four wire conductors 150-1 through 150-4 are grounded by connection to a middle ground shield 159. The middle ground shield 159 may be in the form of a cylinder. However, in one embodiment depicted in dashed line in FIG. 1A, the top of the middle ground shield 159 is a metal ring 159-1 coaxial with the coil antenna 150. Four conductive legs 159a through 159d (of which only the legs 159a and 159c can be seen in the view of FIG. 1A) extend axially downward from the ring 159-1 and have bottom ends contacting the bottom ends of the four conductors 150-1 through 150-4. The middle ground shield 159 provides a uniform and symmetrical distribution of ground current from the four wire conductors 150-1 through 150-4.

Figure 4:
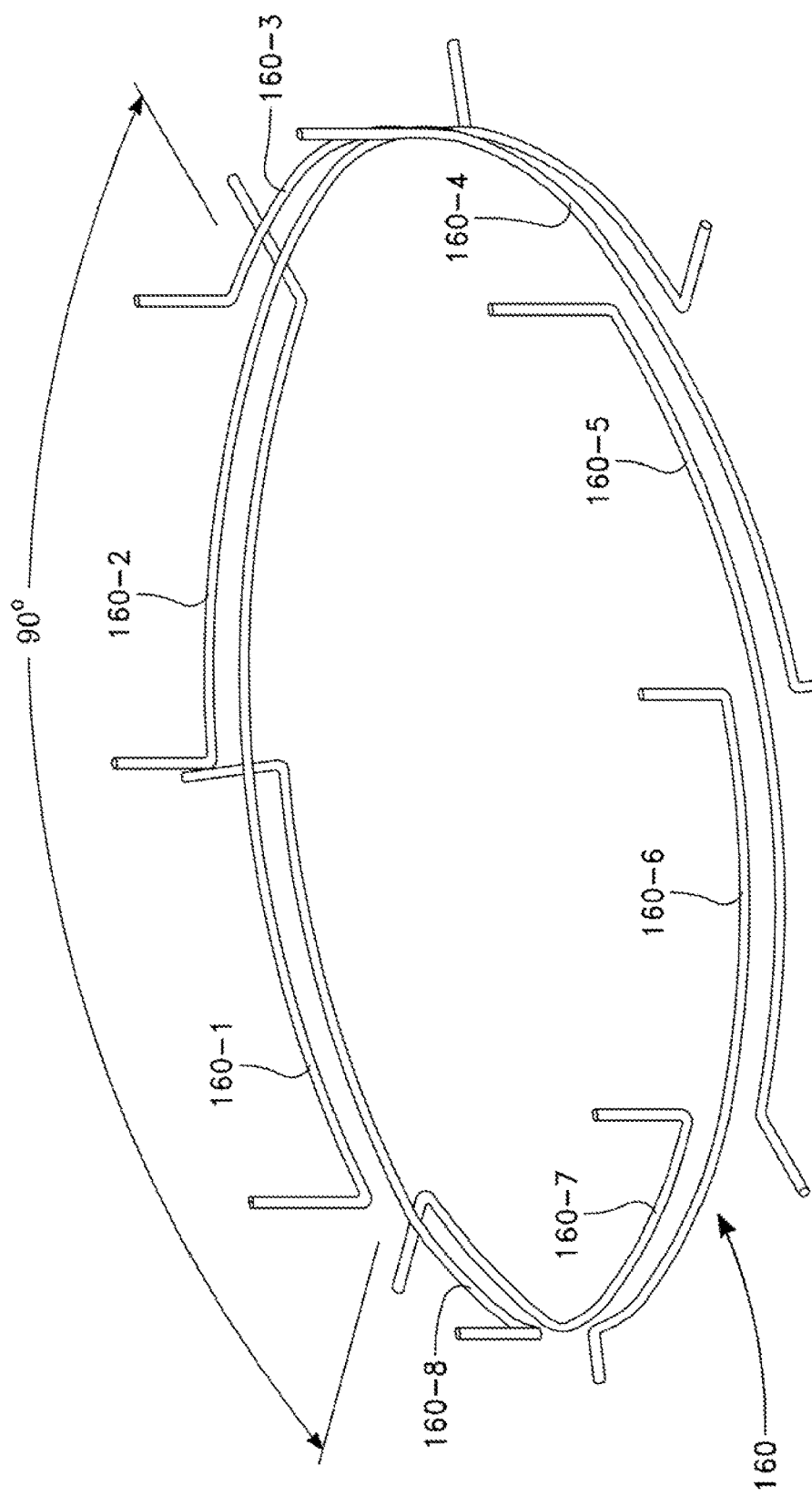
FIG. 4 illustrates an outer zone inductive RF power applicator of the reactor of FIG. 1.

Referring to FIGS. 1A and 4, the side coil antenna 160 is disposed below the plane of the disk shaped dielectric window 112 and surrounds the cylindrical dielectric side window 106. In one embodiment, the side coil antenna 160 includes eight wire conductors 160-1 through 160-8, each one helically wound about a constant radius along an arc length of 90 degrees, their ends being staggered at uniformly spaced 45 degree intervals, as depicted in FIG. 4. Uniform and symmetrical distribution of RF power to the wire conductors 160-1 through 160-8 is provided by an RF current distributor in the form of an inverted metal bowl 162 (FIG. 1A) having a circular bottom edge 164 attached to respective axial conductors 161-1 through 161-8 (of which only the axial conductors 161-1 and 161-5 are visible in the view of FIG. 1A) contacting the top ends of the wire conductors 160-1 through 160-8 respectively. The inverted metal bowl 162 further has a circular top edge 166 connected to a circular array of eight uniformly spaced axial RF feed rods 168. A cylindrical outer chamber wall 170 surrounds the side coil antenna 160 and is grounded. The bottom ends of the eight wire conductors 160-1 through 160-8 are grounded by connection to the outer chamber wall 170. While the described embodiments include direct connection to ground of the coil antennas 140, 150 and 160 by the ground shields 149 and 159 and the outer chamber wall 170, respectively, the connection to ground may not need to be a direct connection, and instead the connection to ground may be through elements such as capacitors, for example.

Figure 5:
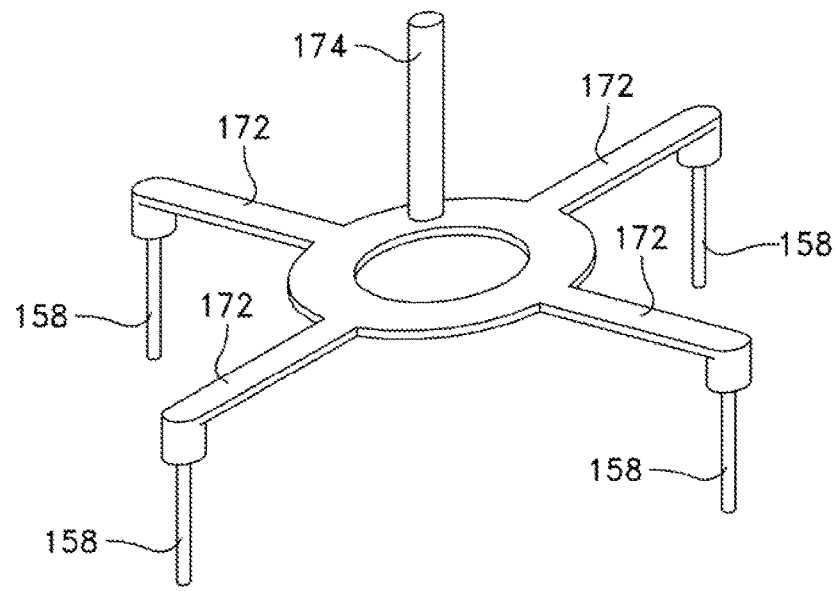
FIG. 5 illustrates a conductive RF power feeder for the RF power applicator of FIG. 3.
Figure 6:
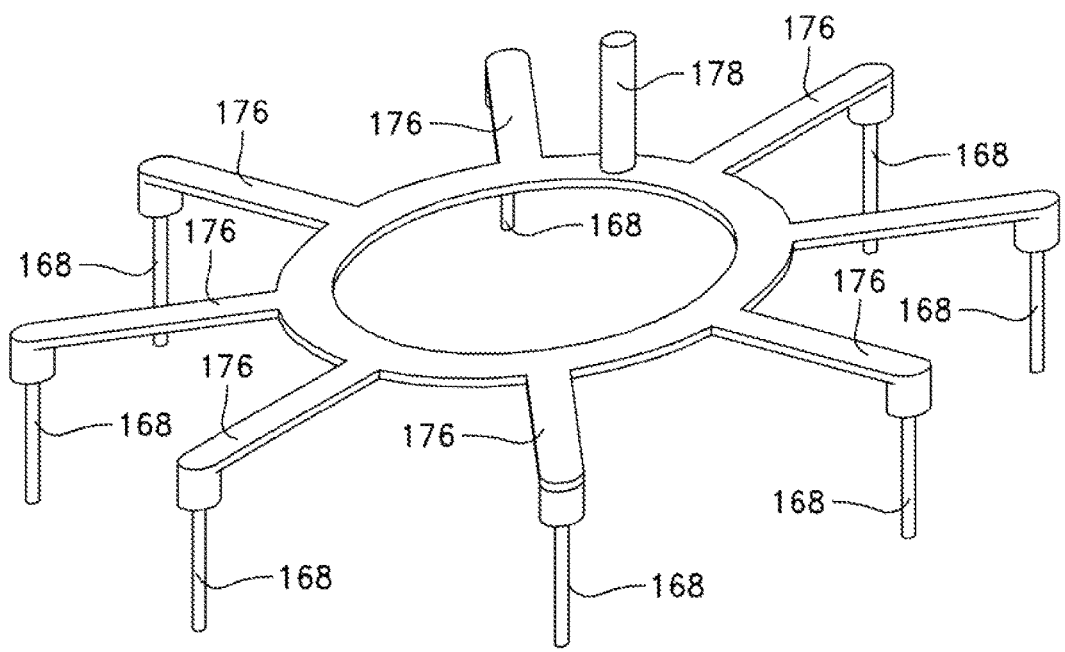
FIG. 6 illustrates a conductive RF power feeder for the RF power applicator of FIG. 4.

Referring to FIG. 5, the four axial RF feed rods 158 associated with the middle coil antenna 150 extend to four radial RF feed rods 172 connected to a common axial feed rod 174. Referring to FIG. 6, the eight axial RF feed rods 168 associated with the side coil antenna 160 extend to eight radial RF feed rods 176 connected to a common axial feed rod 178. The axial RF feed rod 148, the common axial feed rod 174 and the common axial feed rod 178 couple RF power to the respective coil antennas 140, 150 and 160. The power may be supplied from a common RF source or from different RF sources such as RF matches (RF impedance match networks) 180 and 182. As will be described below with reference to FIG. 20B, an RF impedance match network may be employed having dual outputs in order to drive two of the coil antennas with a first RE generator, while a second RF generator and a second RF impedance match network drives the third coil antenna. Alternatively, as will be described below with reference to FIG. 20A, three RF generators may separately drive the three coil antennas through three respective RF impedance match networks. In yet another embodiment, a single RF power generator may drive all three coil antennas through an RF impedance matching network having three outputs. In some implementations of the foregoing embodiments, the RF power levels applied to the different coil antennas may be separately adjusted in order to control radial distribution of plasma ion density. While described embodiments include the three coil antennas 140, 150 and 160, other embodiments may include only one or two of the three described coil antennas 140, 150 and 160.

Only the axial RF feed rod 148 is symmetrically located at the axis of symmetry of the side wall 105, while the axial feed rods 174 and 178 are located off-center, as depicted in FIGS. 1A, 5 and 6. This feature is asymmetrical. The axial RF feed rods 148, 158 and 168 are arrayed symmetrically relative to the axis of symmetry of the side wall 105. A generally disk-shaped conductive ground plate 184 generally parallel with the workpiece support surface 121 contains openings through which the axial RF feed rods 148, 158 and 168 extend. The ground plate 184 provides separation between an upper region containing the non-symmetrically arranged axial feed rods 174 and 178 (and an upper portion of the RF feed rod 148 which is symmetrically located), and a lower region containing only symmetrical features such as the axial RF feed rods 148, 158 and 168. The RF feed rods 148, 158 and 168 are electrically insulated from the ground plate 184. The ground plate 184 electromagnetically shields the processing region 101 from the effects of the asymmetric features above the ground plate 184, and also prevents skew effects in plasma processing of the workpiece 122.

Figure 7:
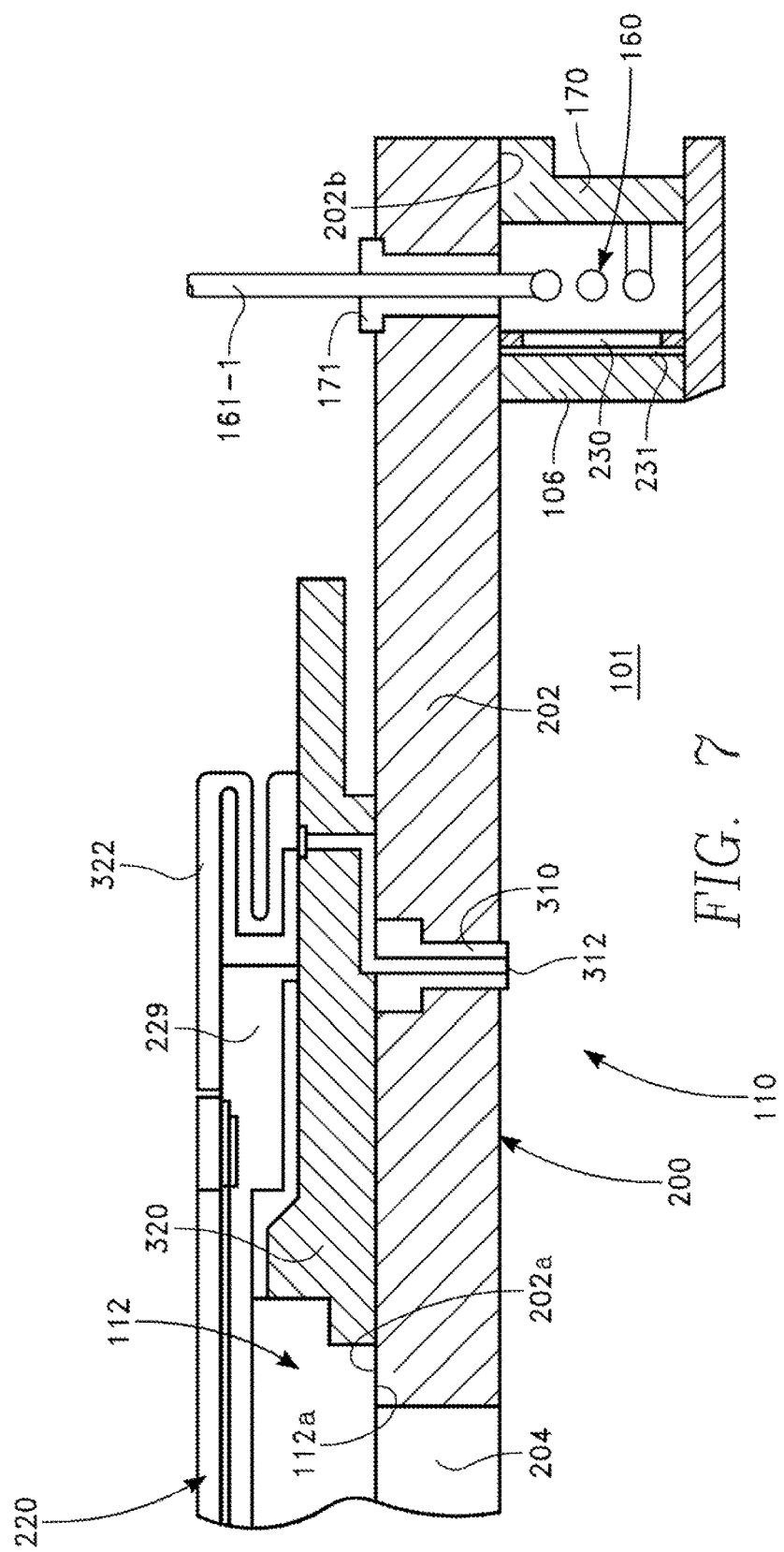
FIG. 7 is a cut-away cross-sectional view of a portion of a lid assembly of the reactor of FIG. 1.

Referring to FIGS. 1 and 7, the disk-shaped dielectric window 112 has a diameter less than the diameter of the outer chamber wall 170. The window 112 is supported at its periphery by an annular top gas plate 200 (described later in this specification) that spans the gap between the outer chamber wall 170 and the window 112, while maintaining the space below the window 112 free of structure that would otherwise inhibit inductive coupling of RF power into the processing region 101. The chamber diameter is therefore not limited by the diameter of the disk-shaped dielectric window 112. The inner and middle coil antennas 140 and 150 (coextensive with the disk-shaped dielectric window 112) may control plasma ion density distribution within an intermediate zone of a diameter smaller than that of the workpiece or wafer 122. Plasma density in an outer zone is governed by the side coil antenna 160 through the cylindrical dielectric window 106. This affords control of plasma ion density distribution across the entire wafer without requiring a concomitant increase in diameter of the disk-shaped dielectric window 112.

As referred to above, the annular top gas plate 200 supports the disk-shaped dielectric window 112 and spans the gap or distance between the outer chamber wall 170 and the periphery of the disk-shaped dielectric window 112. The top gas plate 200 includes an annulus 202 surrounding an opening 204. A top inner edge 202a of the annulus 202 underlies and supports an outer edge 112a of the dielectric window 112 and surrounds the opening 204. A bottom outer edge 202b of the annulus 202 rests on the outer chamber wall 170. The opening 204 faces the disk-shaped dielectric window 112. The axial conductors 161-1 through 161-8 (of the outer coil antenna 160) extend through respective insulators 171 in the top gas plate 200.

Figure 8:
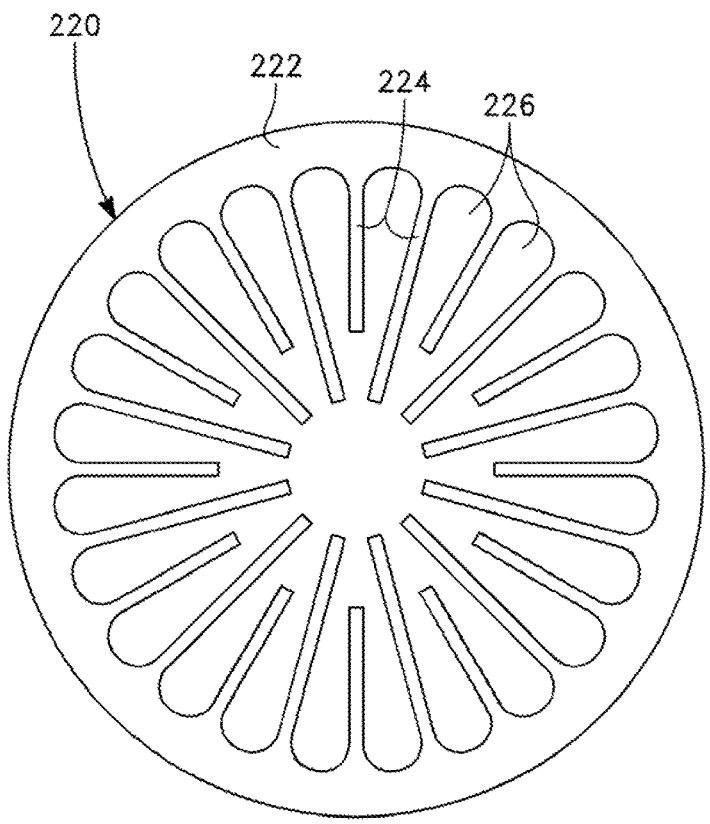
FIG. 8 is a plan view of a heater layer covering a disk-shaped dielectric window of the lid assembly of FIG. 7.

The disk-shaped dielectric window 112 and the cylindrical dielectric side window 106 are heated and have their respective temperatures controlled independently of one another. They are heated and cooled independently, by cooling from a fan system described later in this specification and by independent heater elements now described. A flat heater layer 220 depicted in FIGS. 1A, 7 and 8 overlies the disk-shaped dielectric window 112. The heater layer 220 is in the form of a disk-shaped Faraday shield, having an outer annulus 222 and plural radial fingers 224 extending radially inwardly from the outer annulus 222, the radial fingers 224 being separated from one another by evenly spaced apertures 226. The spacing of the radial fingers 224 (defining the width of the apertures 226) is sufficient to permit inductive coupling of RF power through the heater layer 220. The heater layer 220 is symmetrical with respect to the axis of the side wall 105. In the illustrated example, there are 24 radial fingers 224, although any suitable number of fingers may be employed. The heater layer 220 is heated electrically by an internal electrically resistive element 229 (FIG. 7) within the heater layer 220.

Figure 9:
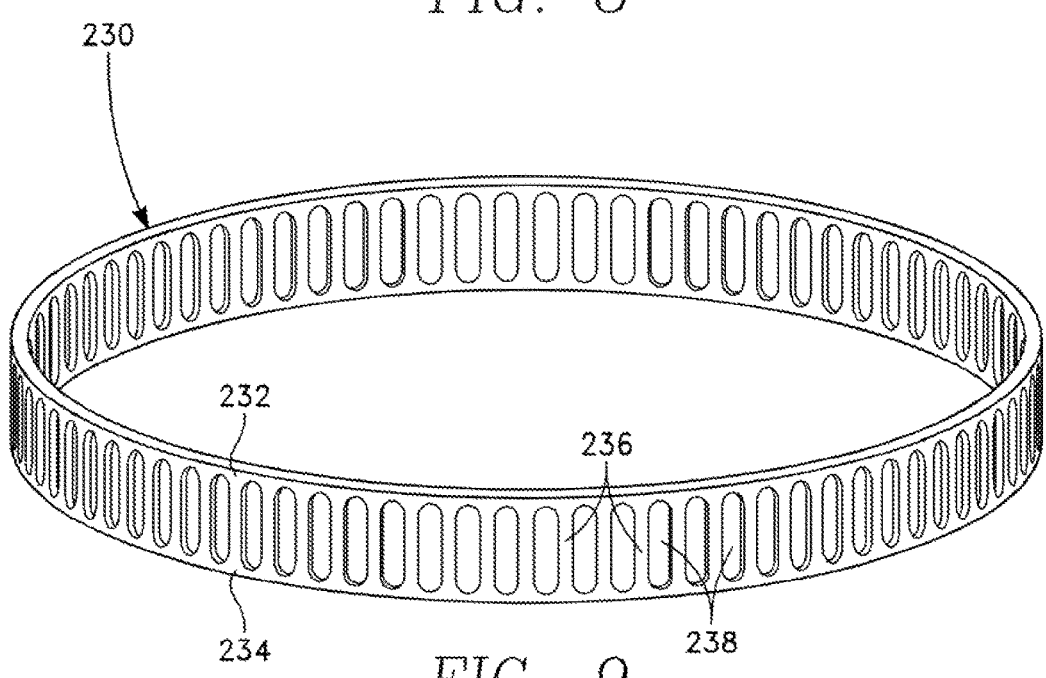
FIG. 9 is an orthographic projection of a heater layer covering a cylindrical dielectric window depicted with the lid assembly of FIG. 7.

A cylindrical Faraday shield layer 230 depicted in FIGS. 1A and 9 is disposed between the cylindrical dielectric window 106 and the outer coil antenna 160, and surrounds the cylindrical dielectric side window 106. The cylindrical Faraday shield layer 230 has upper and lower cylindrical rings 232, 234, and plural axial legs 236 extending axially between the upper and lower cylindrical rings 232, 234 and being separated by evenly spaced gaps 238. The cylindrical Faraday shield layer 230 may be heated electrically by an internal element (such as a heater layer 231 shown in FIGS. 1A and 7) within or contacting with the Faraday shield layer 230.

Process gas is injected into the processing region 101 by a central dual-zone ceiling gas injector 300 (FIG. 1A) and a circular array of peripheral (side) gas injectors 310 (FIG. 7). The ceiling gas injector 300 is located at the center of the disk-shaped dielectric window 112. The peripheral gas injectors 310 are supported on the top gas plate 200 near the side wall 106.

Figure 10:
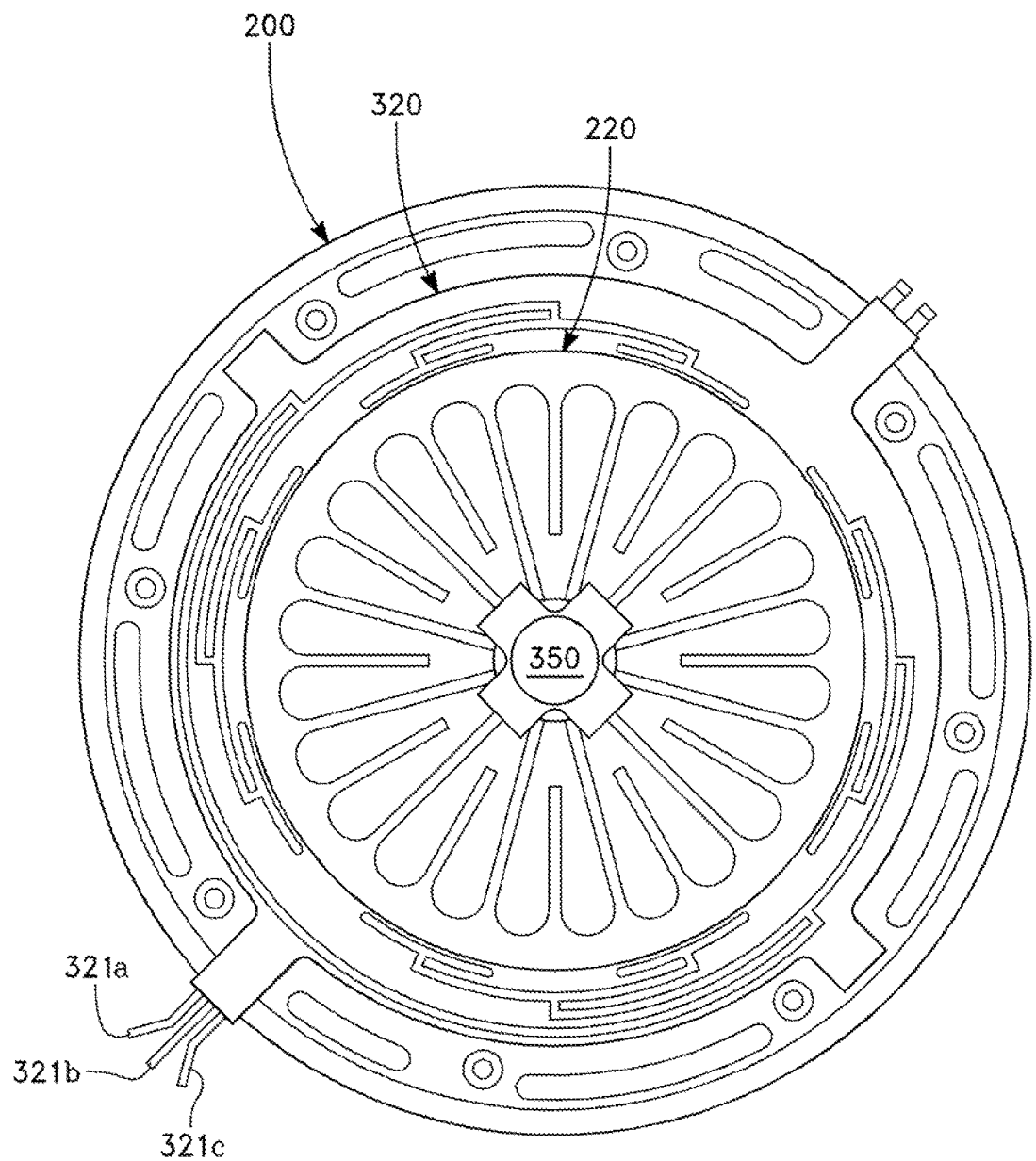
FIG. 10 is a plan view of the lid assembly of FIG. 7.
Figure 11A:
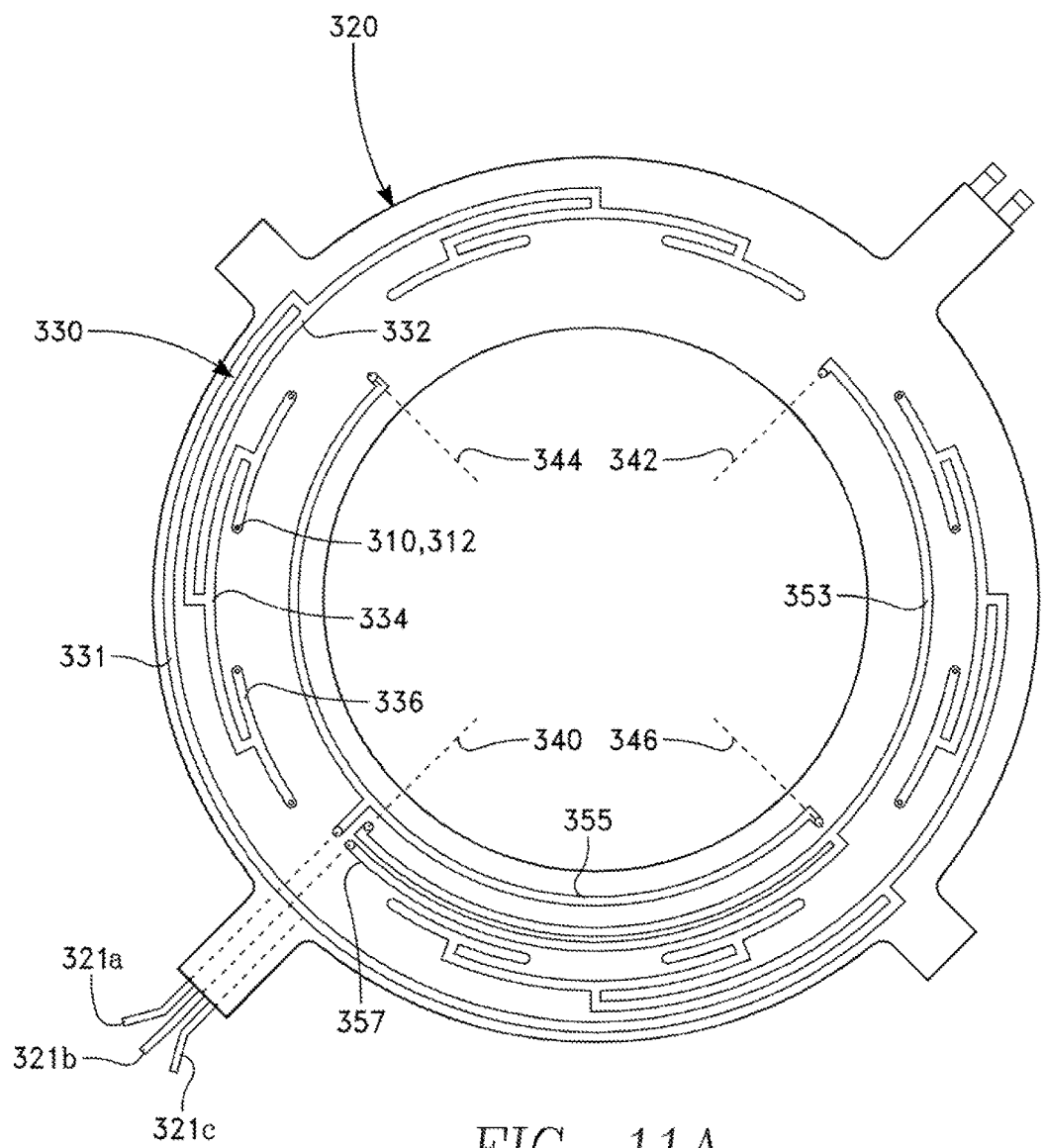
FIG. 11A is a plan view corresponding to FIG. 10 depicting gas flow passages in a gas flow plate of the lid assembly.

Referring to FIGS. 7, 10 and 11A, the lid assembly 110 includes an annular gas flow plate 320. The heater layer or Faraday shield 220 is held on the gas flow plate 320 by a spring plate 322 as shown in FIG. 7. The gas flow plate 320 has three gas input ports 321a, 321b, 321c (FIG. 10). The gas flow plate 320 provides recursive gas flow paths from the input port 321a to a first zone of the dual zone ceiling gas injector 300, recursive gas flow paths from the input port 321b to the other zone of the dual zone gas injector 300, and recursive gas flow paths from the gas input port 321c to the side gas injectors 310. The side gas injectors 310 are fed through respective gas ports 312 in the bottom surface of the gas flow plate 320 visible in the bottom view of FIG. 11B. The recursive gas flow paths provide uniformly distributed gas flow path lengths to different gas injection zones. Uniformity control of the gas distribution can also be enhanced by the recursive gas flow paths.

Referring to FIG. 11A, a first set or hierarchy of recursive gas flow paths 330 in the gas flow plate 320 feeds gas to the side gas injectors 310 through the gas ports 312. The first set of recursive gas flow paths 330 includes a half-circular gas flow path or channel 331. The gas injection port 321c is coupled to the midpoint of the half-circular gas flow channel 331. The gas flow path 331 extends around half a circle and feeds at its ends the midpoints of a pair of arcuate gas flow paths 332 each extending a quarter circle, which in turn feed at their respective ends the midpoints of four arcuate gas flow paths 334 each extending around an eighth circle. The four arcuate gas flow paths 334 feed at their ends the midpoints of eight arcuate gas flow paths 336 each extending around a sixteenth of a circle. The ends of the gas flow paths 336 feed the gas ports 312 for gas flow to the side gas injectors 310.

Figure 12:
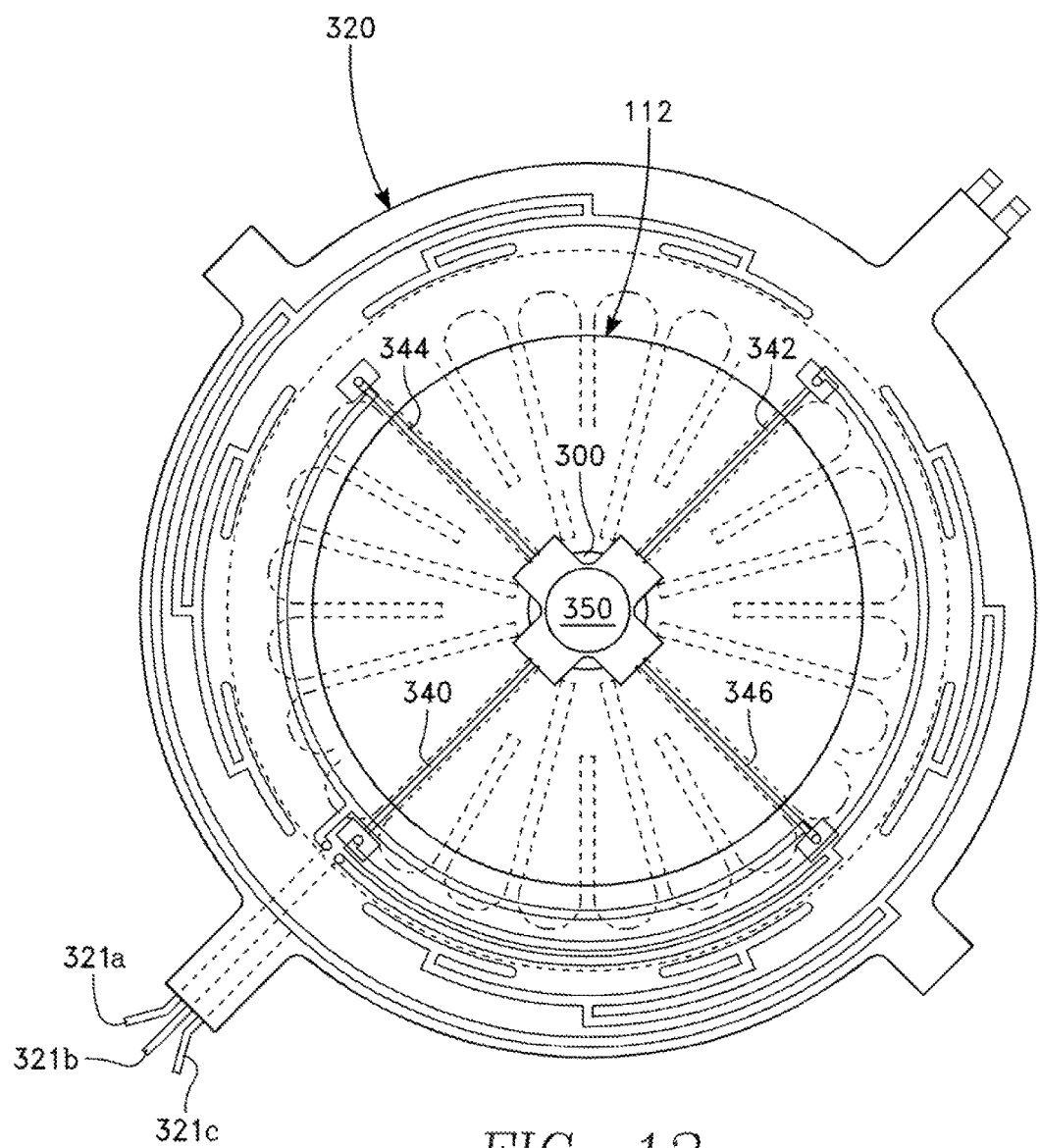
FIG. 12 is a plan view corresponding to FIG. 10 and depicting gas flow paths to a center hub.

Referring to FIG. 12, gas flow to one zone of the dual zone gas injector 300 is carried in a pair of opposing radial gas flow lines 340, 342 overlying the disk-shaped dielectric window 112. Gas flow to the other zone of the dual zone gas injector 300 is carried in a second pair of opposing radial gas flow lines 344, 346 overlying the disk-shaped dielectric window 112 and disposed at right angles to the first pair of radial gas flow lines 340, 342. Connection from the four radial gas flow lines 340, 342, 344, 346 to the dual zone gas injector 300 is provided by a gas flow hub 350 axially coupled to the dual zone gas injector 300.

Referring again to FIG. 11A, a half-circular gas flow channel 353 provides uniform distribution of gas flow from the gas input port 321b to the outer ends of the first pair of radial gas flow lines 340, 342. A quarter-circular gas flow channel 357 provides gas flow from the input port 321b to the midpoint of the half-circular gas flow channel 354. A half-circular gas flow channel 355 provides uniform gas flow from the gas input port 321a to the outer ends of the second pair of radial gas flow lines 344, 346.

Figure 12A:
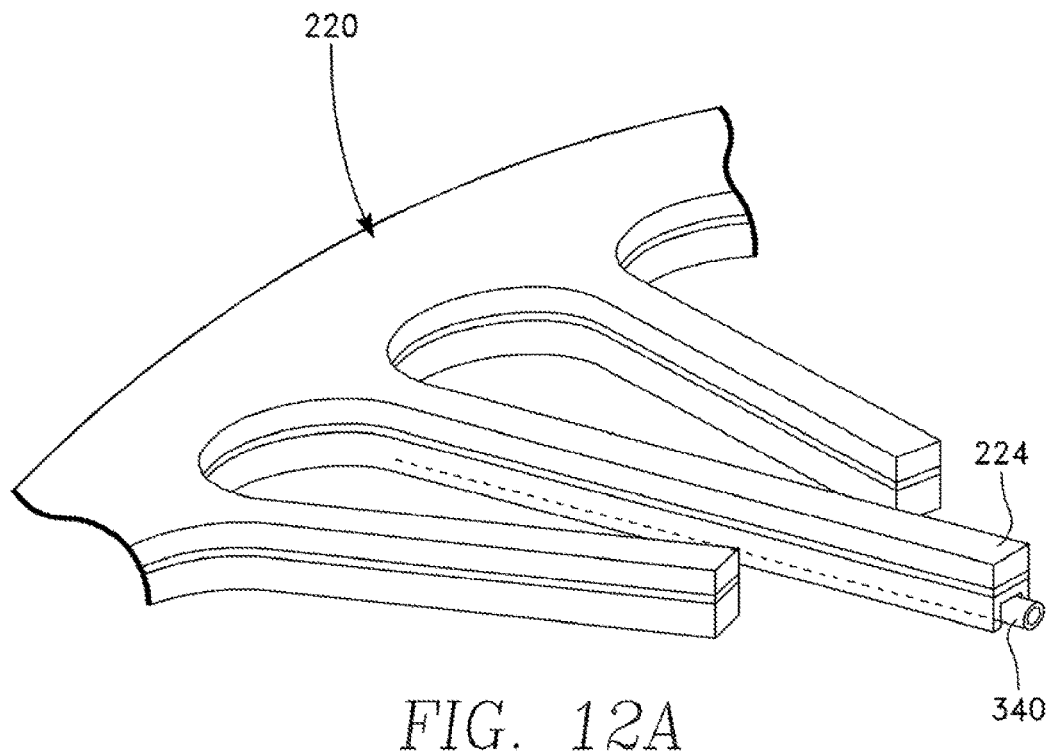
FIG. 12A is an orthographic projection corresponding to a portion of FIG. 12 depicting encasement of a gas flow conduit in a portion of the heater layer of FIG. 8.
Figure 12B:
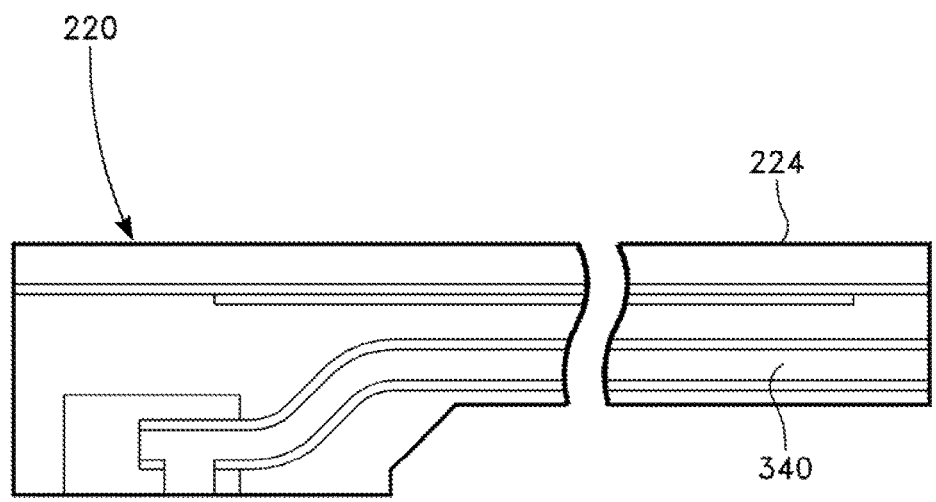
FIG. 12B is a cut-away elevational view corresponding to FIG. 12A.

As depicted in FIGS. 12, 12A and 12B, each of the four radial gas flow lines 340, 342, 344, 346 overlying the disk-shaped dielectric window 112 may be enclosed in a respective one of the radial fingers 224 of the heater layer 220.

Figure 13:
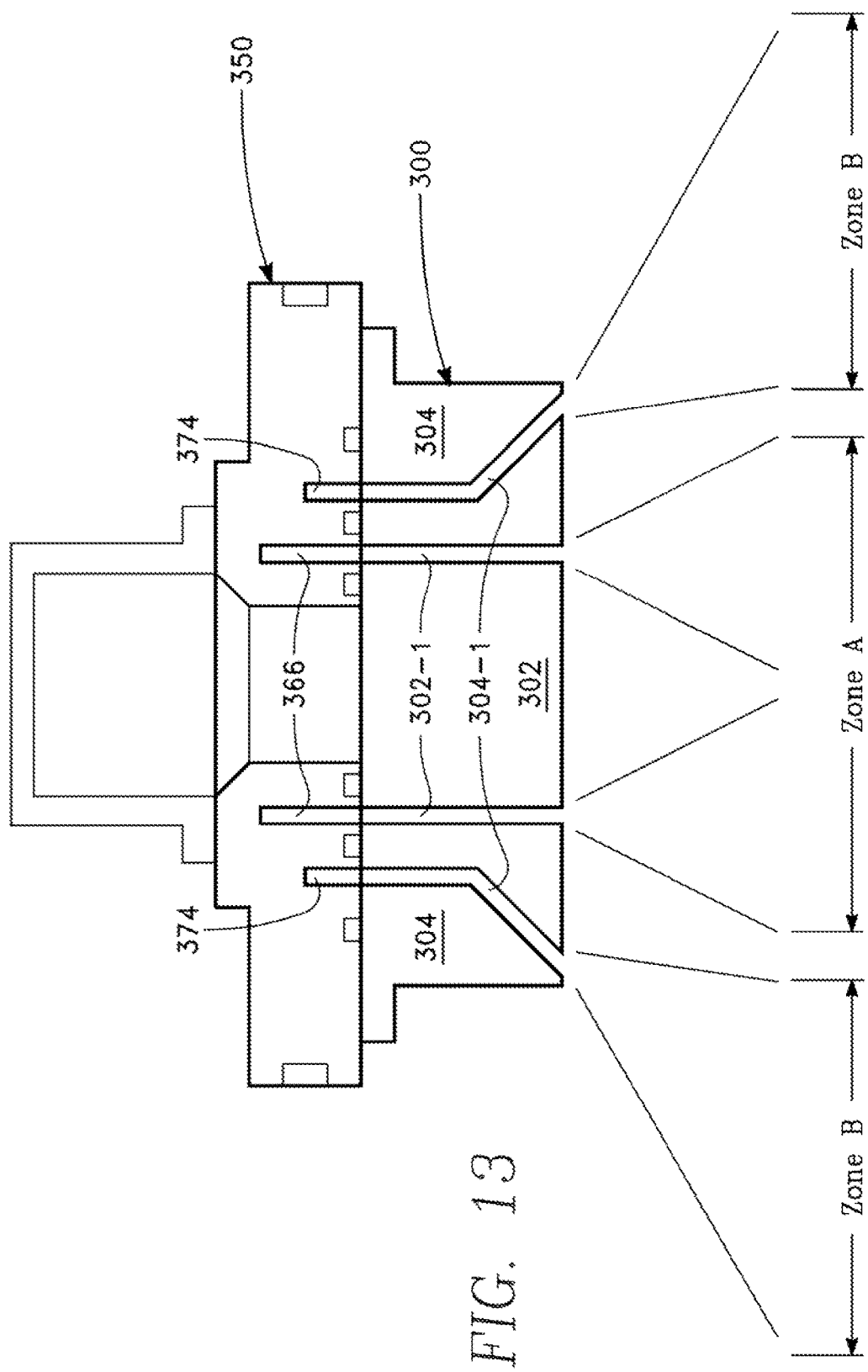
FIG. 13 is an enlarged cut-away view of a center gas disperser of the reactor of FIG. 1.
Figure 14:
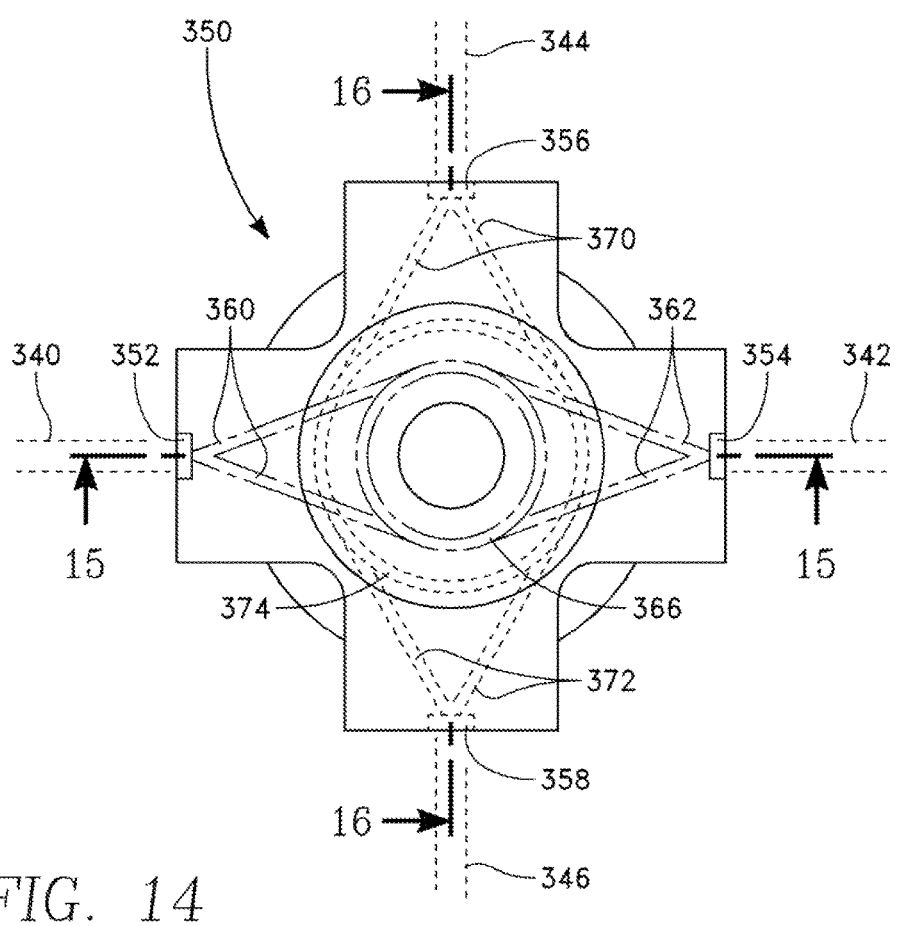
FIG. 14 is a plan view of the center gas disperser of FIG. 13.
Figure 15:
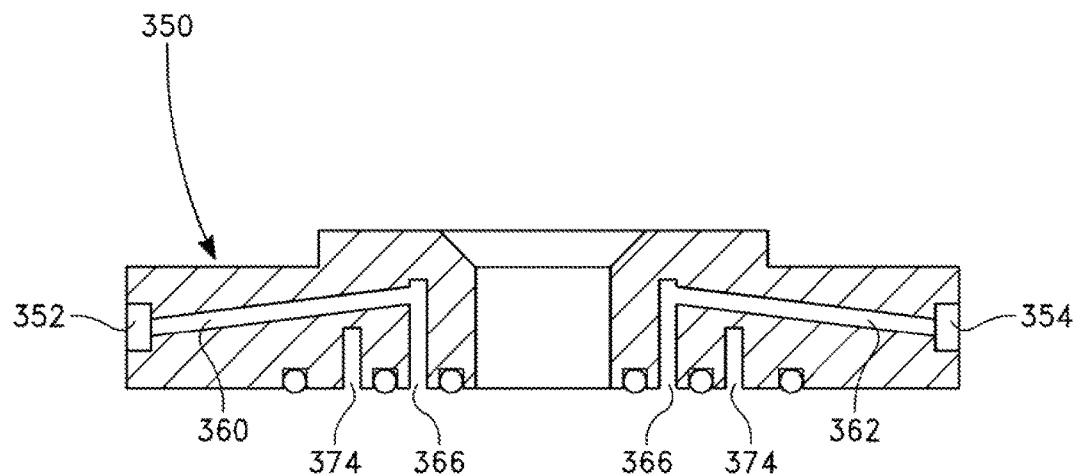
FIG. 15 is a cross-sectional view taken along lines 15-15 of FIG. 14.
Figure 16:
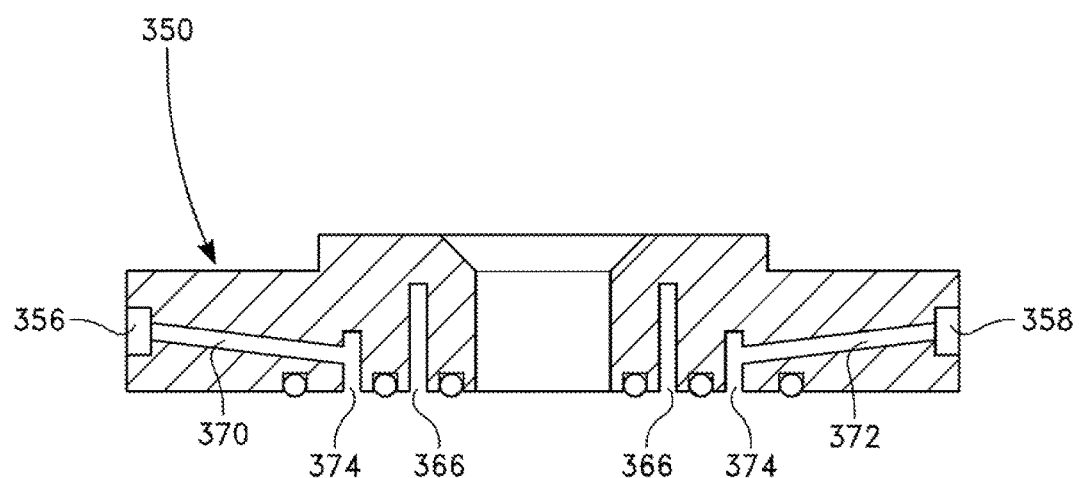
FIG. 16 is a cross-sectional view taken along lines 16-16 of FIG. 14.
Figure 17:
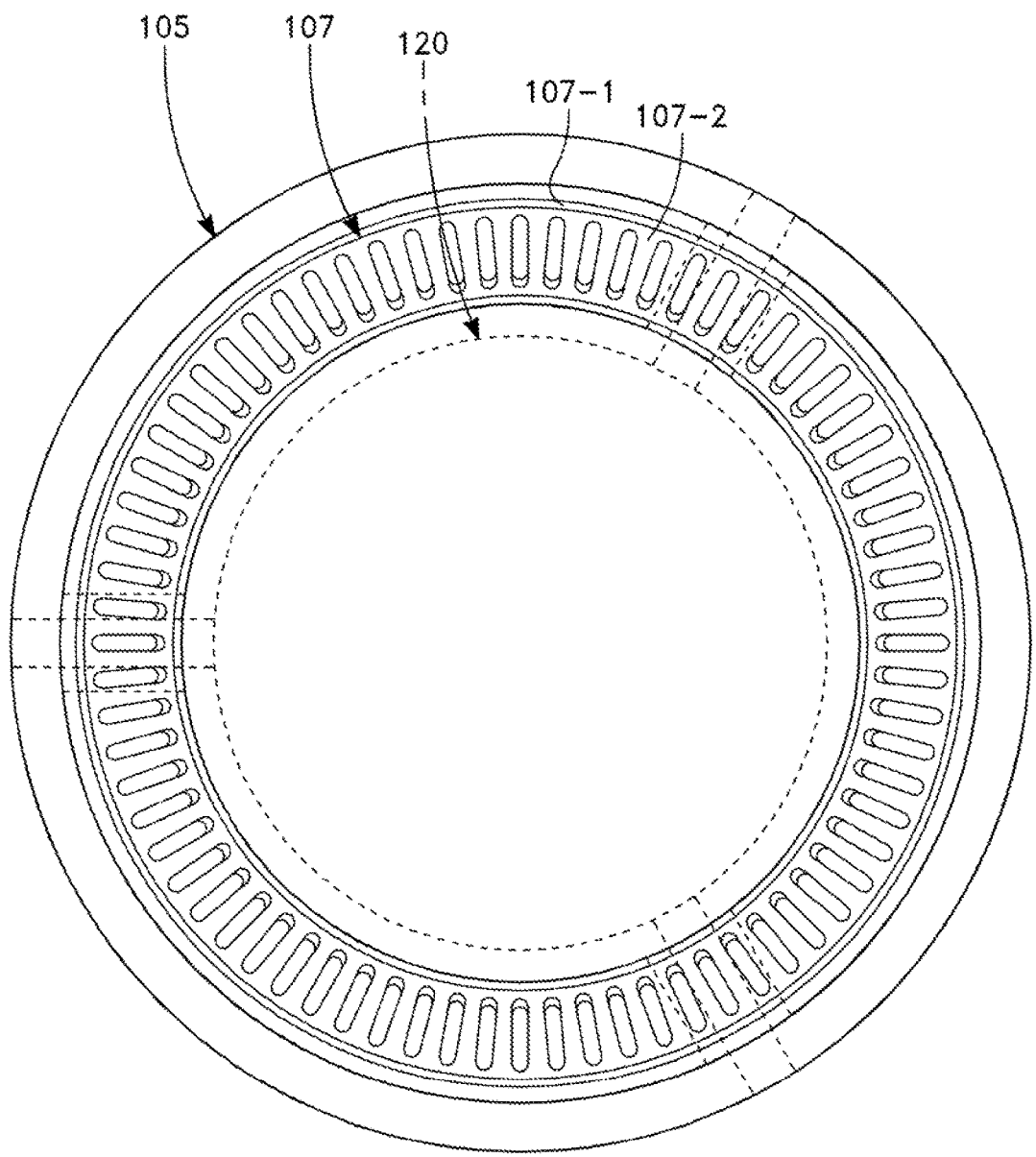
FIG. 17 is a cross-sectional view taken along lines 17-17 of FIG. 1B.
Figure 18:
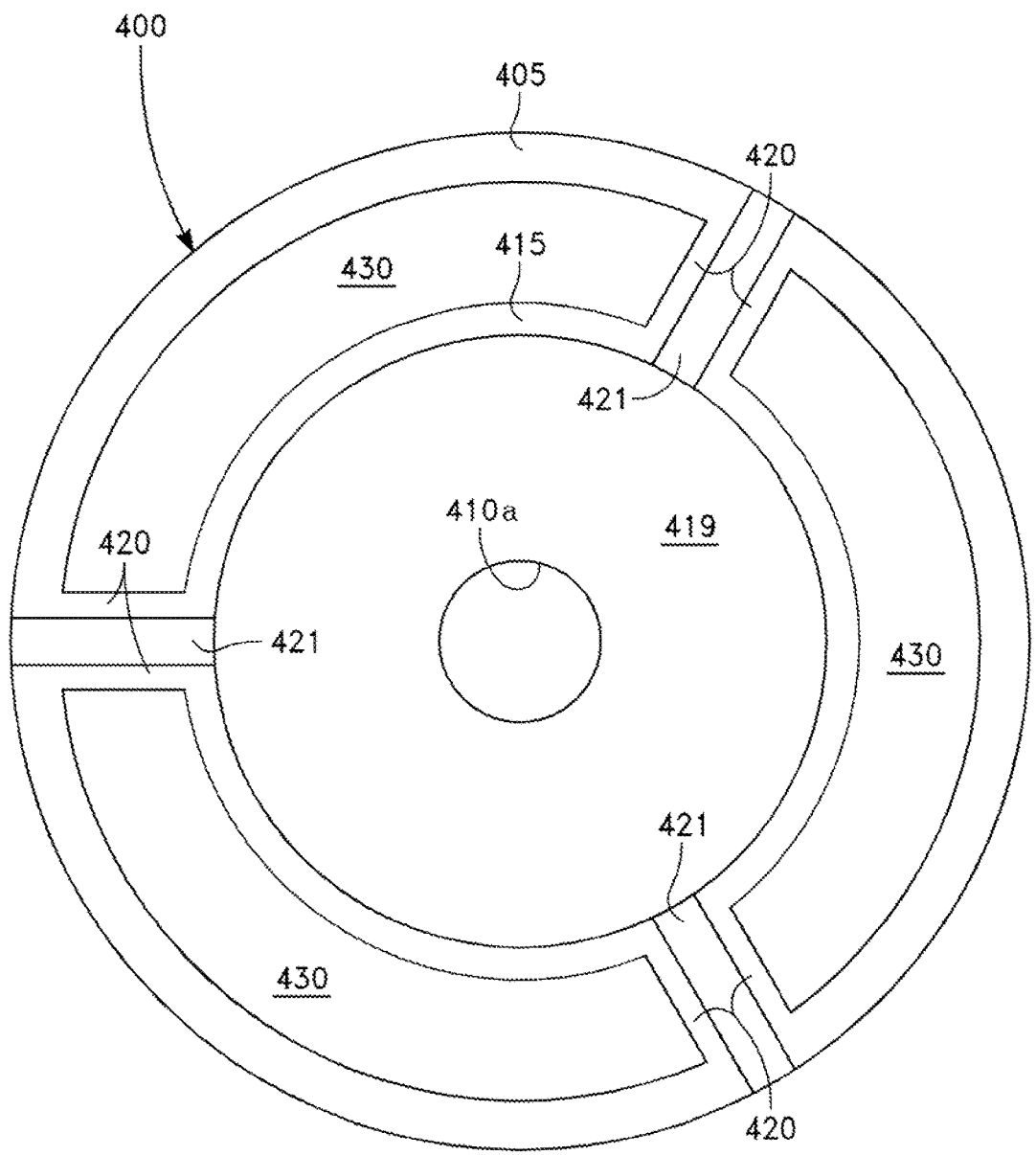
FIG. 18 is a cross-sectional view taken along lines 18-18 of FIG. 1B.

As previously described with reference to FIGS. 1 and 12, the gas flow hub 350 provides coupling between the four radial gas flow lines 340, 342, 344, 346 and the dual zone gas injector 300. One example of the dual zone gas injector 300 is depicted in FIG. 13. The dual zone gas injector 300 of FIG. 13 includes a center gas disperser 302 having an axial inner annular channel 302-1 extending axially and dispersing gas to a radially inner zone A, and a middle gas disperser 304 having a slanted middle annular channel 304-1 dispersing gas to a radially outer zone B. The gas flow hub 350 is now described with reference to FIGS. 13, 14, 15 and 16. The hub 350 has four gas inlet ports 352, 354, 356 and 358 oriented at right angles to one another and connectable to the four radial gas flow lines 340, 342, 344, 346 as indicated in dashed line. The gas inlet ports 352 and 354 feed respective pairs of split gas distribution lines 360, 362, respectively, that terminate at four equally spaced points along a circular inner distribution channel 366 that is in registration with the axial inner annular channel 302-1 of the dual zone gas injector 300. The gas inlet ports 356 and 358 feed respective pairs of split gas distribution lines 370, 372, respectively, that terminate at four equally spaced points along a circular middle distribution channel 374 that is in registration with the axial middle annular channel 304-1 of the dual zone gas injector 300.

Figure 11B:
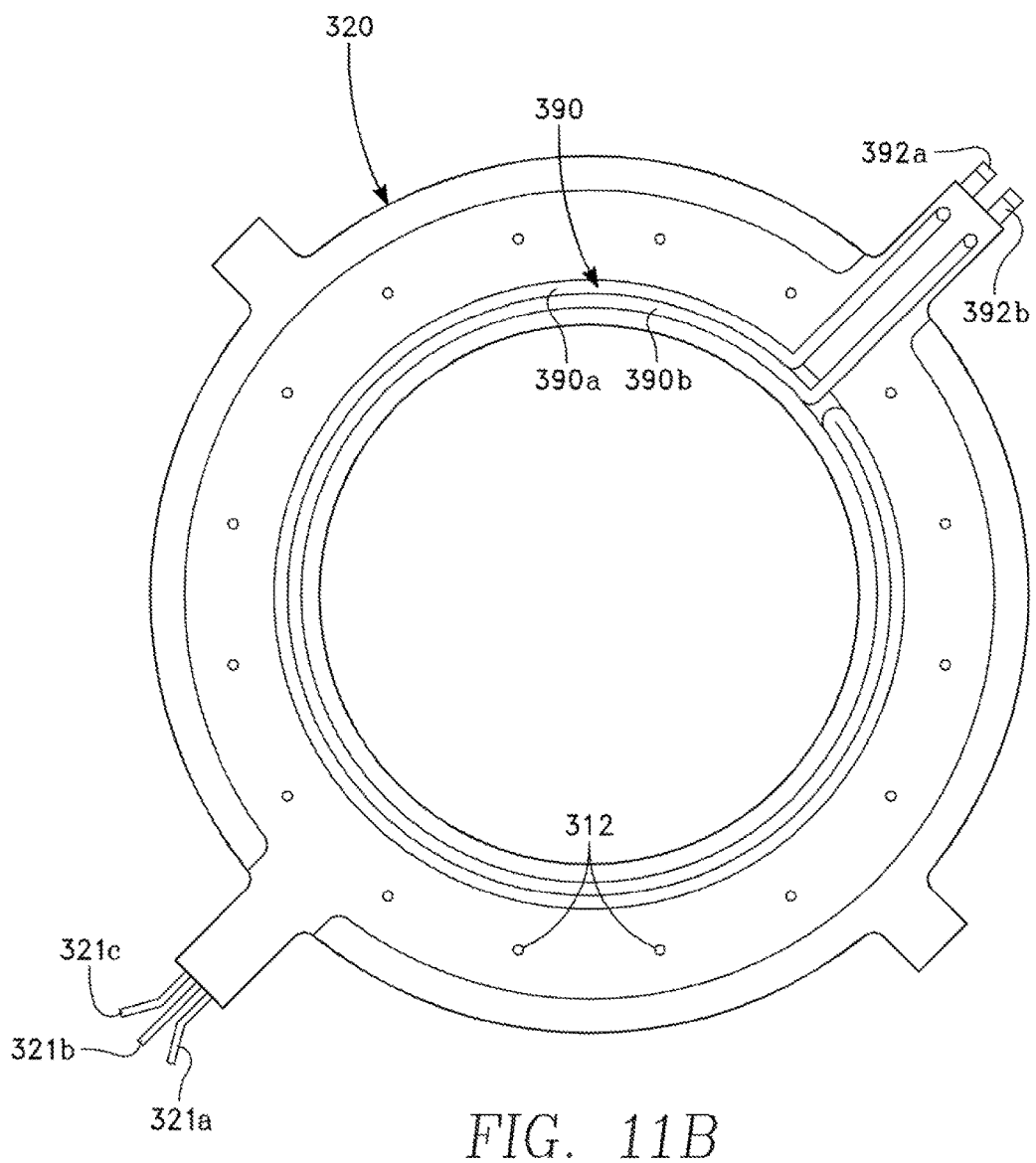
FIG. 11B is a view of an opposite side of the gas flow plate of FIGS. 7 and 11A.

Referring again to the bottom view of FIG. 11B, in one embodiment, optional cooling passages 390 may be provided in the gas flow plate 320, in the form of a circular supply passage 390a and a circular return passage 390b forming a continuous path. External coolant ports 392a and 392b provided connection of the supply and return passages 390a, 390b to an external coolant source (not illustrated in FIG. 11B). Optionally, internal coolant passages may be provided in the outer chamber body wall 170 and fed through a coolant input port.

Referring to FIGS. 1 and 1B, the chamber liner 107 is enclosed within a lower chamber body 400 including a cylindrical lower chamber body side wall 405 and a lower chamber body floor 410. The lower chamber body side wall 405 and the lower chamber body floor 410 enclose an evacuation region 411. The chamber liner 107 includes an upper cylindrical section 107-1 and a lower annular grid 107-2 in the form of an inverted truncated cone. A vacuum pump 440 is disposed in a vacuum pump opening 410a in the floor 410 and is centered relative to the axis of symmetry of the side wall 105. A containment wall 415 coaxial with the workpiece support 115 and a flexible bellows 417 extending between the pedestal 120 and the containment wall 415 enclose the workpiece support 115 in an internal central space 419. The central space 419 is isolated from the volume evacuated by the vacuum pump 440, including the evacuation region 411 and the processing region 101. Referring to FIGS. 1B, 17, 18 and 19, there are three hollow radial struts 420 defining radial access passages 421 spaced at 120 degree intervals extending through the chamber body side wall 405 and providing access to the central space 419. Three axial exhaust passages 430 are defined between the three radial struts 420. Different utilities may be provided through different ones of the radial access passages 421, including the RF power cable 132 connected to the electrode 130, heater voltage supply lines connected to heater elements in the workpiece support 115, an electrostatic chucking voltage supply line connected to the electrode 130, coolant supply lines and helium supply lines for backside helium gas channels in the workpiece support surface 121, for example. A workpiece support lift actuator 450 is fixed with respect to the chamber body and moves the workpiece support 115 axially. The workpiece support lift actuator 450 may be used to vary the distance between the workpiece 122 and the lid assembly 110. Varying this distance varies the distribution of plasma ion density. Movement of the lift actuator may be used to improve uniformity of distribution of process (e.g., etch) rate across the surface of the workpiece 122. The lift actuator 450 may be controlled by the user through a programmable controller, for example.

The axially centered exhaust assembly including the vacuum pump opening 410a and the axial exhaust passages 430 avoids asymmetries or skew in processing distribution across the workpiece 122. The annular grid 107-2 masks the processing region 101 from the discontinuities or effects of the radial struts 420. The combination of the axially centered exhaust assembly with the symmetrical distribution of RF current flow below the ground plate 184 minimize skew effects throughout the processing region 101 and enhance process uniformity in the processing region 101.

Figure 19:
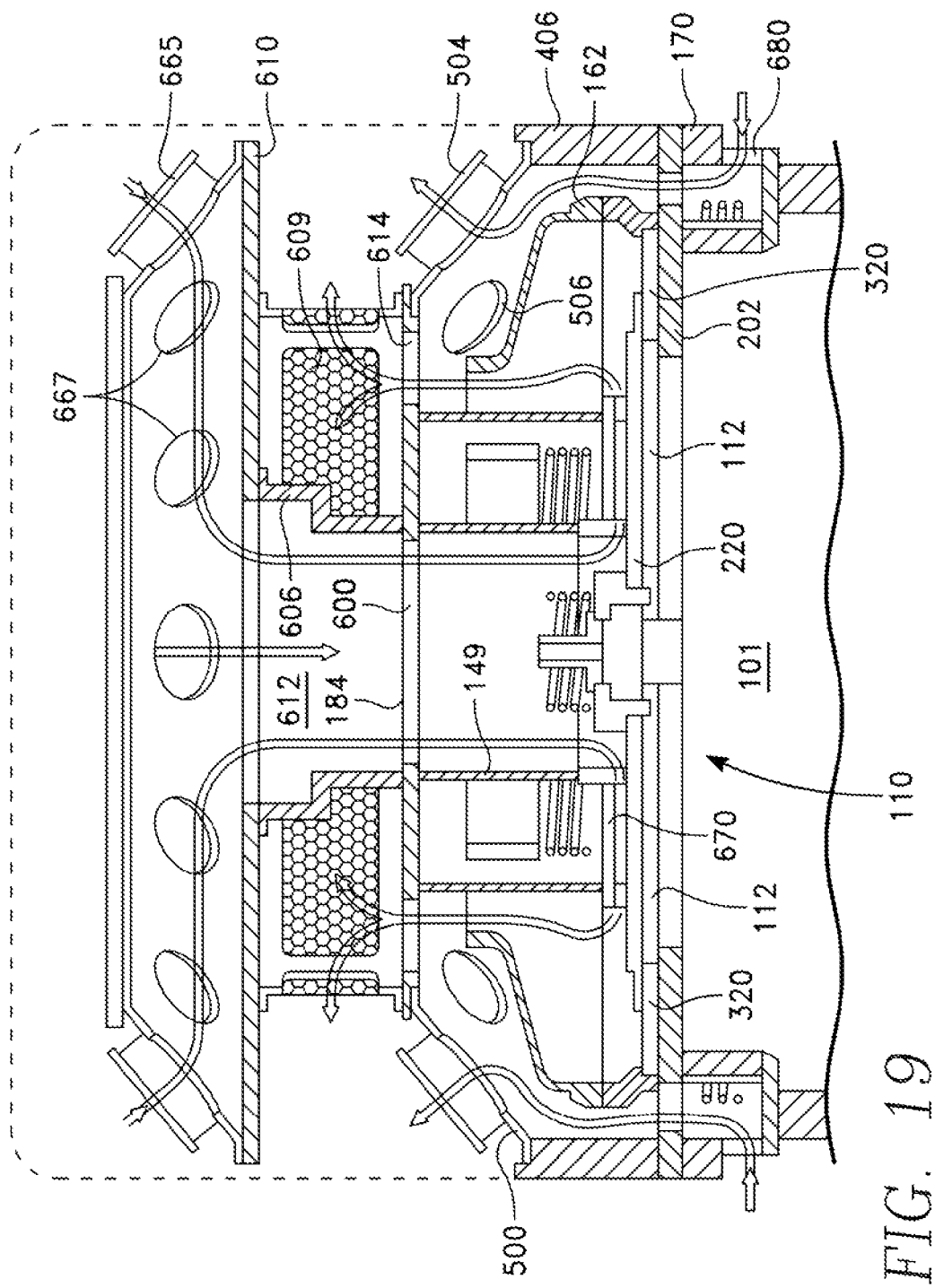
FIG. 19 is a view corresponding to FIG. 1A and depicting cooling air flow paths.

FIG. 19 depicts cooling air flow through the upper section 20 of FIG. 1A. Referring to FIGS. 1A and 19, a chamber body side wall 406 surrounds the lid assembly 110. A lower plenum wall 500 in the form of a truncated cone, for example, is mounted between the top edge of the chamber body side wall 406 and the peripheral edge of the ground plate 184, to enclose a lower plenum 502. A circular array of exhaust fans 504 are mounted in respective openings 506 in the lower plenum wall 500.

The ground plate 184 has a center opening 600 that is co-extensive with the inner ground shield 149. A cylindrical plenum center wall 606 is coextensive with the center opening 600. A plenum plate 610 overlies the plenum center wall 606. A return chamber 612 is enclosed between a return chamber side wall 608, the plenum plate 610, the ground plate 184 and the center wall 606. The return chamber side wall 608 includes air flow screen sections 609. Openings 614 through the ground plate 184 permit air flow between the lower plenum 502 and the return chamber 612.

An upper plenum 650 is enclosed between a top plate 655 and the plenum plate 610 by an upper plenum side wall 660 in the form of a truncated cone. Plural intake fans 665 are mounted at respective openings 667 in the upper plenum side wall 660.

The intake fans 665 draw air into the upper plenum 650 which flows down through the central opening formed by the center wall 606, the ground plate opening 600 and the middle grounded shield 149. An annular air flow plate 670 overlying the disk-shaped dielectric window 112 confines the air flow between the plate 670 and the window 112. This air may flow through the apertures 226 of the Faraday shield 220 of FIG. 8, for example. Alternatively (or in addition), the air may be confined in a gap 671 between the air flow plate 670 and the window 112. Downward air flow through the cylindrical shield 149 enters the space within the aperture 226 through a central opening of the plate 670 and flows radially outwardly over the disk-shaped dielectric window 112 and enters the lower plenum 502. From the lower plenum 502, the air escapes into the return chamber 612, from which it may exit through the screen sections 609 of the return chamber side wall 608. Thus, the intake fans 665 provide cooling for the disk-shaped dielectric window 112.

The exhaust fans 504 provide cooling for the cylindrical dielectric window 106. The exhaust fans 504 draw air through intake ports 680 in the lower chamber side wall 170 and past the cylindrical dielectric window 106. By operating the intake fans 665 independently from the exhaust fans 504, the different heat loads on the different dielectric windows 106 and 112 may be compensated independently, for accurate temperature control of each window.

Figure 20A:
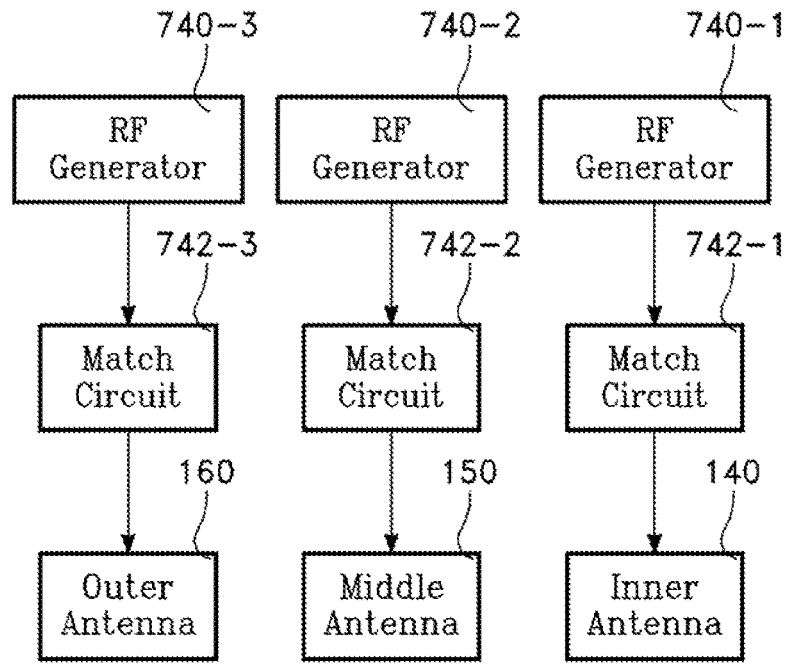
FIGS. 20A and 20B are block diagrams of alternative embodiments of RF power sources for the RF power applicators of FIG. 1A.
Figure 20B:
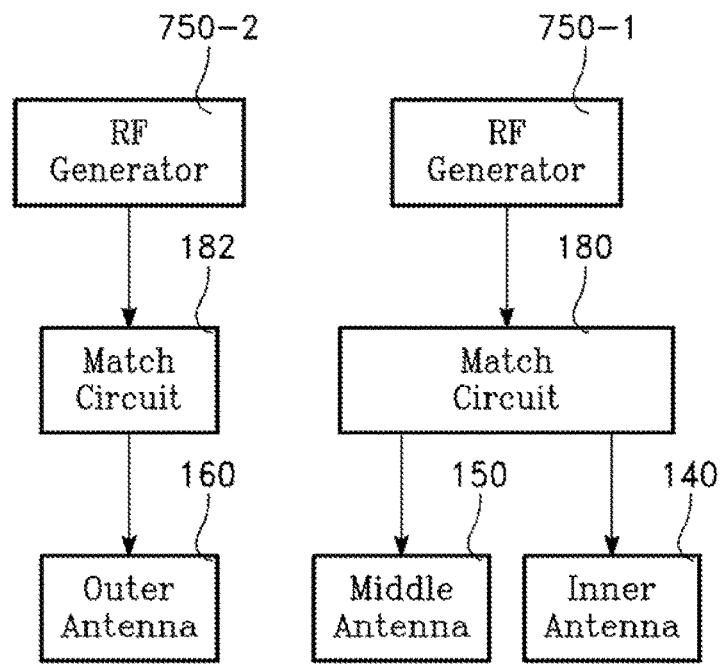

FIG. 20A depicts one embodiment of an RF source for the three coil antennas 140, 150, 160, the RF source having independent RF generators 740-1, 740-2, 740-3, and RF impedance matching networks 742-1, 742-1, 742-3 for the respective coil antennas 140, 150, 160. FIG. 20B depicts an embodiment in which the inner and middle coil antennas 140, 150 are driven from a single RF generator 750-1 through an RF impedance matching network 180 having dual outputs. The dual output RF impedance matching network 180 may facilitate differential control of the power levels applied to the inner and middle coil antennas 140, 150. The outer coil antenna 160 is driven by an RF generator 750-2 through an RF impedance matching network 182. The dual output RF impedance matching network 180 functions as two separate RF power sources, so that there are a total of three RF power sources in the system. In each of the foregoing embodiments, the RF impedance match networks may be disposed on the top plate 655 as depicted in FIG. 1A.

Figure 21:
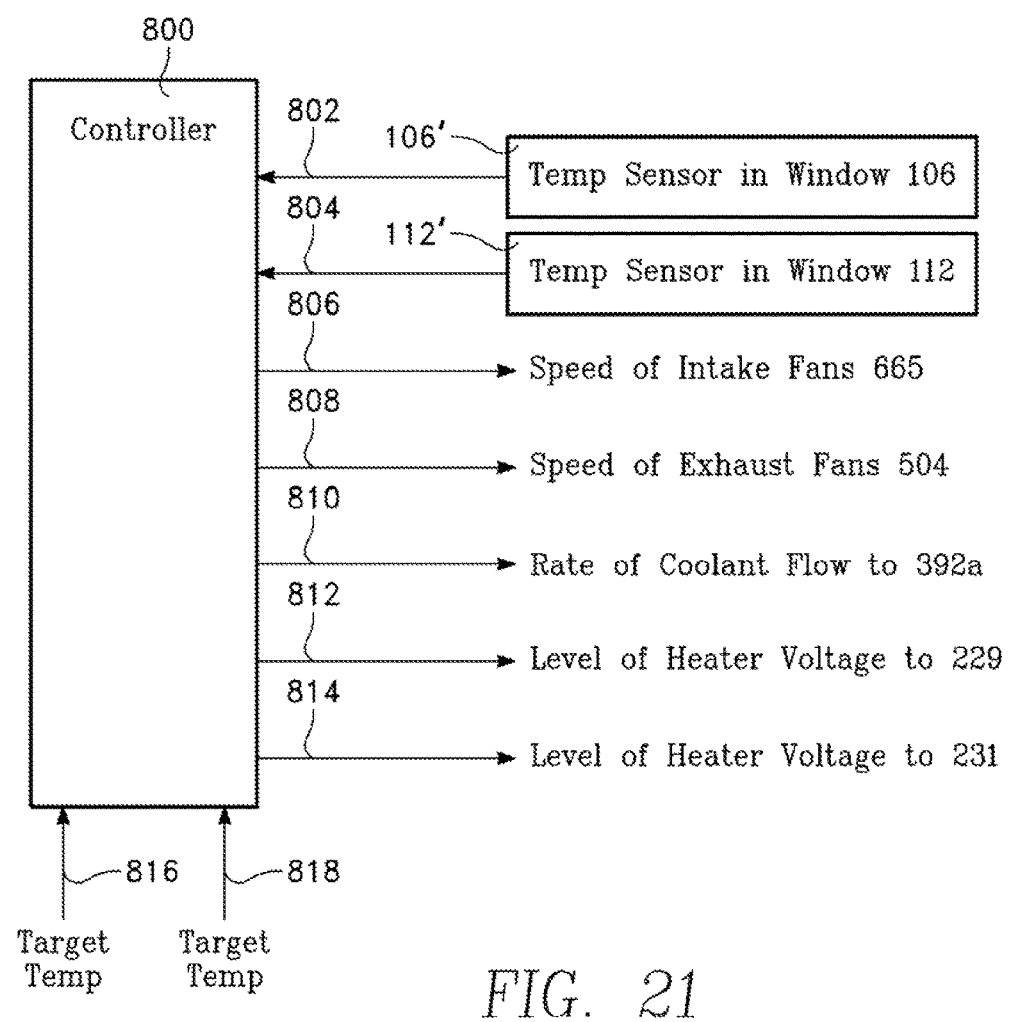
FIG. 21 is a block diagram of a control system controlling the reactor of FIG. 1.

FIG. 21 depicts a control system for controlling the plasma reactor of FIG. 1. The control system is responsive to temperature sensors at different locations within the plasma reactor, such as a temperature sensor 106' at or in the cylindrical dielectric window 106, and a temperature sensor 112' at or in the disk-shaped dielectric window 112. The control system includes a programmable controller 800 which may be implemented as a microprocessor, for example. The controller 800 has an input 802 for receiving the output of the temperature sensor 106' and an input 804 for receiving the output of the temperature sensor 112'. The controller 800 has independent command outputs, including an output 806 governing the speed of the intake fans 665, an output 808 governing the speed of the exhaust fans 504, an output 810 governing the flow rate of coolant to the coolant port 392a in the gas flow plate 320, an output 812 governing the power level to the electric heater 229 near the dielectric window 112, and an output 814 governing the power level to the electric heater 231 at the cylindrical dielectric window 106.

The controller 800 in one embodiment is programmed to govern the outputs 808-814 in response to the inputs 802, 804 to maintain the windows 106, 112 at respective target temperatures that may be furnished by a user to controller inputs 816 and 818. The controller 800 may be programmed to operate in the manner of a feedback control loop to minimize the difference between the user input 816 and the sensor input 802, and to minimize the difference between the user input 818 and the sensor input 804.

As described above, some of the advantageous effects of various ones of the foregoing embodiments include symmetrical distribution of RF power to the coil antennas for enhanced plasma distribution symmetry. Shielding of the coils from assymetrical RF current feed structures reduces skew effects in plasma distribution. Shielding of the coil antennas from one another enhances independent control of the coil antennas, for superior control of plasma density distribution. Symmetrical chamber exhaust in combination with the symmetrical coil antennas provides a high density plasma source with symmetrical plasma distribution. Separate dielectric windows for different RF coils enables independent thermal control of the different dielectric windows. Separately supporting the different dielectric windows at or over the processing region enables the chamber diameter to be increased beyond the diameter of each individual dielectric window, facilitating a large increase in chamber diameter. The moveable workpiece support electrode in combination with symmetrical coil antenna(s) allows superior control over center-to-edge plasma density distribution with a minimized asymmetrical non-uniformity component. The moveable workpiece support electrode in combination with symmetrical coil antenna(s) and in further combination with the symmetrical chamber exhaust allows even better control over center-to-edge plasma density distribution with minimized asymmetrical non-uniform component.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
    an axially symmetrical side wall, a ceiling overlying said side wall and a vertically movable workpiece support, said workpiece support including a pedestal having a planar workpiece support surface, said side wall, said ceiling and said workpiece support defining a processing region;
    an inner coil antenna disposed on an external side of said ceiling and overlying a first radial zone of said processing region;
    a disk-shaped dielectric window in said ceiling facing said inner coil antenna;
    an outer coil antenna surrounding said side wall;
    a cylindrical dielectric window in said side wall facing said outer coil antenna;
    an exhaust chamber wall defining an evacuation region below said processing region, and an exhaust pump port in a floor of said evacuation region;
    an upper housing above said ceiling enclosing said inner coil antenna and said outer coil antenna, said upper housing divided into a first air flow path that extends from a first inlet past said disk-shaped dielectric window to a first outlet and an independent second air flow path that is substantially isolated from the first air flow path and extends from a second inlet past said cylindrical dielectric window to a second outlet;
    a first set of air fans positioned to direct air along the first air flow path;
    a second set of air fans positioned to direct air along the second air flow path; and
    a controller configured to independently control said first and second sets of air fans.

2. The plasma reactor of claim 1 wherein said inner and outer coil antennas are coupled to receive RF power.

3. The plasma reactor of claim 1 wherein said side wall, said inner coil antenna and said outer coil antenna are coaxial.

4. The plasma reactor of claim 1 wherein said ceiling comprises an annular member supported on said side wall and having a central opening, a peripheral portion of said disk-shaped dielectric window resting on an inner edge of said central opening.

5. The plasma reactor of claim 1 further comprising a grounded conductive shield surrounding said inner coil antenna.

6. The plasma reactor of claim 5 wherein said grounded conductive shield comprises a cylindrical portion coaxial with said side wall.

7. The plasma reactor of claim 1 further comprising:
    respective separately controlled heater layers on respective ones of said dielectric windows; and wherein said controller is configured to independently control said respective heater layers.

8. The plasma reactor of claim 1, comprising:
a containment wall surrounded by said exhaust chamber wall and enclosing a central region, said containment wall including a floor extending below said workpiece support, said central region comprising a volume isolated from said evacuation region, said containment wall including a flexible bellows providing a sidewall coupled between the pedestal and the floor;
plural radial access passages extending through said containment wall and through said exhaust chamber wall and open to said central region, whereby said radial access passages provide access to said central region;
a lift mechanism positioned in said central region and having an upper end attached to said workpiece support and a lower end attached to the floor of the containment wall within the central region, the lift mechanism configured to raise and lower the pedestal and planar workpiece support surface relative to the floor of the containment wall;
plural axial exhaust passages between said processing region and said evacuation region; and
a chamber liner comprising a grid extending across said plural axial exhaust passages.

9. The plasma reactor of claim 8, wherein the volume is bounded on bottom and sides by said containment wall and on top by said workpiece support.

10. The plasma reactor of claim 8, wherein the evacuation region extends below the floor of the containment wall.

11. The plasma reactor of claim 8, wherein the workpiece support comprises two or more from a heater element, an electrode, or channels to receive a coolant.

12. The plasma reactor of claim 11, comprising two or more utilities from an RF power cable connected to the electrode, an electrostatic chucking voltage supply line connected to the electrode, a heater voltage supply line connected to the heater element, and a coolant supply line connected to the channels.

13. The plasma reactor of claim 12, wherein different ones of said utilities extend through different ones of said radial access passages.

* * * * *